United States Patent
Park et al.

(10) Patent No.: US 10,482,935 B2
(45) Date of Patent: Nov. 19, 2019

(54) NONVOLATILE MEMORY INCLUDING DUTY CORRECTION CIRCUIT AND STORAGE DEVICE INCLUDING THE NONVOLATILE MEMORY

(71) Applicant: Samsung Electronics Co., Ltd., Suwon-si, Gyeonggi-do (KR)

(72) Inventors: Jung-june Park, Seoul (KR); Jeong-Don Ihm, Seongnam-si (KR); Byung-hoon Jeong, Hwaseong-si (KR); Eun-ji Kim, Suwon-si (KR); Ji-yeon Shin, Anyang-si (KR); Young-don Choi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/982,431

(22) Filed: May 17, 2018

(65) Prior Publication Data
US 2018/0350414 A1    Dec. 6, 2018

Related U.S. Application Data

(60) Provisional application No. 62/513,507, filed on Jun. 1, 2017.

(30) Foreign Application Priority Data

Aug. 1, 2017 (KR) .................. 10-2017-0097815

(51) Int. Cl.
*G11C 7/22* (2006.01)
*G11C 16/32* (2006.01)
(Continued)

(52) U.S. Cl.
CPC .......... *G11C 7/222* (2013.01); *G11C 7/1066* (2013.01); *G11C 16/32* (2013.01); *G11C 7/1057* (2013.01);
(Continued)

(58) Field of Classification Search
CPC ....... G11C 7/222; G11C 7/1066; G11C 16/32; G11C 2207/2254; G11C 7/1057; G11C 16/26; H03K 5/1565; H03K 3/017
(Continued)

(56) References Cited

U.S. PATENT DOCUMENTS 7,223,115 B2  5/2007 Hashim et al.
7,256,554 B2  8/2007 Lys
(Continued)

FOREIGN PATENT DOCUMENTS

JP    5198057 B2    5/2013

OTHER PUBLICATIONS

International Search Report and Written Opinion dated Sep. 10, 2018 from the Intellectual Property Office of Singapore in Application No. 10201804069T.

*Primary Examiner* — Tha-O H Bui
(74) *Attorney, Agent, or Firm* — Harness, Dickey & Pierce, P.L.C.

(57) ABSTRACT

Provided is a nonvolatile memory including a clock pin configured to receive an external clock signal during a duty correction circuit training period; a plurality of memory chips configured to perform a duty correction operation on an internal clock signal based on the external clock signal, the plurality of memory chips configured to perform the duty correction operation in parallel during the training period; and an input/output pin commonly connected to the plurality of memory chips, wherein each of the plurality of memory chips includes: a duty correction circuit (DCC) configured to perform the duty correction operation on the internal clock signal; and an output buffer connected between an output terminal of the DCC and the input/output pin.

20 Claims, 19 Drawing Sheets

(51) Int. Cl.
  *G11C 7/10* (2006.01)
  *G11C 16/26* (2006.01)
  *H03K 3/017* (2006.01)
  *H03K 5/156* (2006.01)

(52) U.S. Cl.
  CPC ...... *G11C 16/26* (2013.01); *G11C 2207/2254* (2013.01); *H03K 3/017* (2013.01); *H03K 5/1565* (2013.01)

(58) Field of Classification Search
  USPC .................................................. 365/189.011
  See application file for complete search history.

(56) References Cited

U.S. PATENT DOCUMENTS

| | | |
|---|---|---|
| 7,282,976 B2 | 10/2007 | Park |
| 7,310,010 B2 | 12/2007 | Minzoni et al. |
| 7,358,706 B2 | 4/2008 | Lys |
| 7,459,864 B2 | 12/2008 | Lys |
| 7,557,521 B2 | 7/2009 | Lys |
| 7,659,673 B2 | 2/2010 | Lys |
| 7,675,338 B2 | 3/2010 | Boerstler et al. |
| 7,777,543 B2 * | 8/2010 | Park .................. H03K 5/13 327/172 |
| 8,553,473 B2 | 10/2013 | Kim et al. |
| 8,624,647 B2 | 1/2014 | Chong et al. |
| 8,644,085 B2 | 2/2014 | Kim et al. |
| 9,369,118 B2 | 6/2016 | Nakata |
| 9,535,119 B2 | 1/2017 | Thiruvengadam et al. |
| 2003/0052719 A1 * | 3/2003 | Na .................. H03K 5/131 327/158 |
| 2014/0002156 A1 | 1/2014 | Dwivedi et al. |
| 2016/0104520 A1 * | 4/2016 | Kang .................. G11C 7/222 365/233.1 |
| 2016/0357454 A1 | 12/2016 | Lee et al. |
| 2017/0053684 A1 * | 2/2017 | Choi .................. G11C 7/222 |
| 2017/0083259 A1 | 3/2017 | Lee et al. |
| 2017/0288634 A1 | 10/2017 | Kang et al. |

* cited by examiner

NONVOLATILE MEMORY INCLUDING DUTY CORRECTION CIRCUIT AND STORAGE DEVICE INCLUDING THE NONVOLATILE MEMORY

CROSS-REFERENCE TO RELATED APPLICATION

This application claims the benefit of U.S. Ser. No. 62/513,507, filed on Jun. 1, 2016, in the U.S. Patent and Trademark Office, and Korean Patent Application No. 10-2017-0097815, filed on Aug. 1, 2017, in the Korean Intellectual Property Office, the disclosures of each of which are incorporated herein in their entireties by reference.

BACKGROUND

Inventive concepts relate to a memory device, and more particularly, to a nonvolatile memory including a duty correction circuit, a storage device including the nonvolatile memory, and an operating method of the storage device.

A storage device may include a nonvolatile memory and a controller for controlling the nonvolatile memory. Conventionally, communication between the nonvolatile memory and the controller has been performed at a lower operating frequency than communication between a controller and a memory system including a high-speed memory such as a dynamic random access memory (DRAM) or a static random access memory (SRAM). However, in recent years, performing communication between the nonvolatile memory and the controller at a high operating frequency has been desired or required.

SUMMARY

According to some example embodiments of inventive concepts, there is provided a nonvolatile memory including a clock pin configured to receive an external clock signal during a duty correction circuit training period; a plurality of memory chips configured to perform a duty correction operation on an internal clock signal based on the external clock signal, the plurality of memory chips configured to perform the duty correction operation in parallel during the training period; and an input/output pin commonly connected to the plurality of memory chips, wherein each of the plurality of memory chips includes: a duty correction circuit (DCC) configured to perform the duty correction operation on the internal clock signal; and an output buffer connected between an output terminal of the DCC and the input/output pin.

According to some example embodiments of inventive concepts, there is provided a nonvolatile memory including: a clock pin configured to receive an external clock signal during a duty correction circuit training period; an input/output pin configured to transmit and receive a data signal or a data strobe signal; a buffer chip connected to the clock pin and the input/output pin and configured to buffer the external clock signal to generate the buffered external clock signal; a plurality of memory chips configured to perform a duty correction operation on an internal clock signal based on the buffered external clock signal in parallel, wherein the buffer chip includes: a first duty correction circuit (DCC) configured to perform the duty correction operation on an output signal received from one of the plurality of memory chips a first output buffer connected between an output terminal of the first DCC and the input/output pin.

According to some example embodiments of inventive concepts, there is provided a nonvolatile memory including: a clock pin configured to receive an external clock signal during a duty correction circuit training period; an input/output pin configured to transmit and receive a data signal or a data strobe signal; first and second buffer chips commonly connected to the clock pin and the input/output pin and configured to buffer the external clock signal to generate the first and second buffered external clock signal respectively s; and a plurality of memory chips including first memory chips configured to perform in parallel a duty correction operation on a first internal clock signal based on the first buffered external clock signal and second memory chips configured to perform in parallel the duty correction operation on a second internal clock signal based on the second buffered external clock signal.

According to some example embodiments of inventive concepts, there is provided a nonvolatile memory including: a clock pin configured to receive an external clock signal during a duty correction circuit training period; an input/output pin configured to transmit and receive a data signal or a data strobe signal; and a memory chip connected to the clock pin and the input/output pin, wherein the memory chip includes: an internal circuit configured to receive the external clock signal through the clock pin and generate the internal clock signal from the received external clock signal; a duty correction circuit (DCC) configured to perform a duty correction operation on the internal clock signal; and an output buffer connected between an output terminal of the DCC and the input/output pin.

BRIEF DESCRIPTION OF THE DRAWINGS

Embodiments of inventive concepts will be more clearly understood from the following detailed description taken in conjunction with the accompanying drawings in which.

DETAILED DESCRIPTION OF THE EMBODIMENTS

Figure 1:
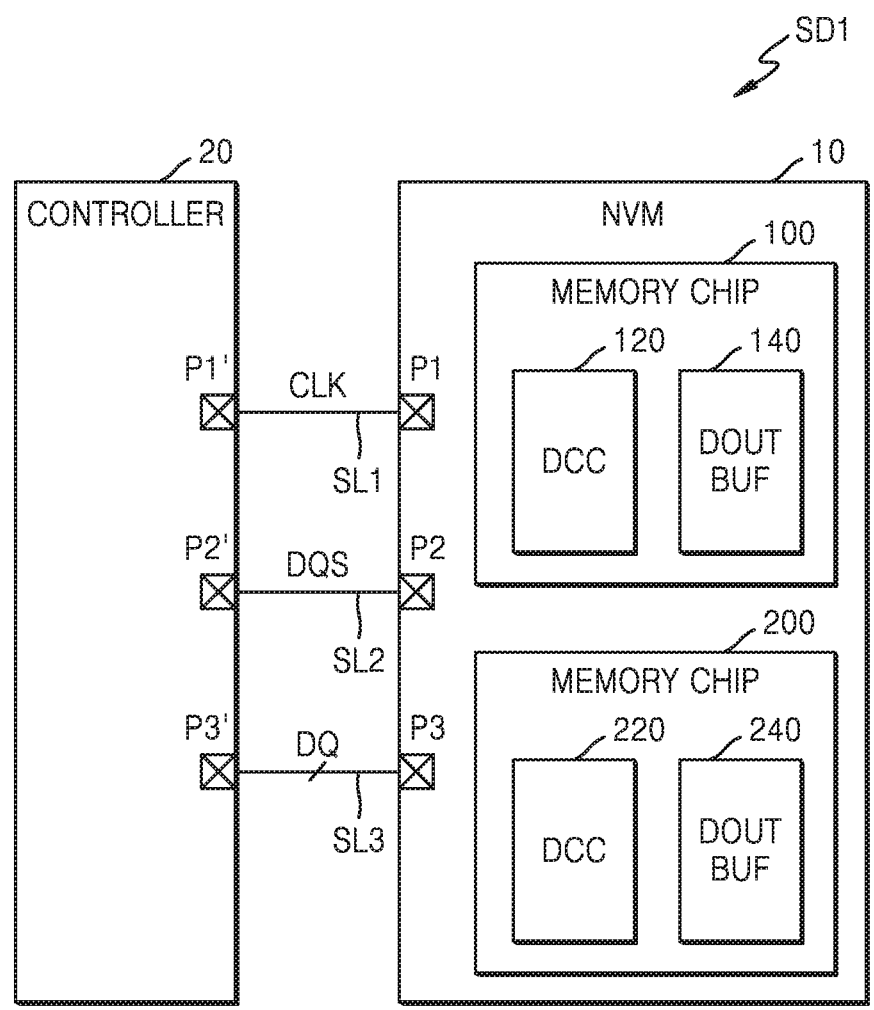
FIG. 1 is a schematic block diagram of a storage device according to an example embodiment of inventive concepts.

FIG. 1 is a schematic block diagram of a storage device SD1 according to an example embodiment of inventive concepts.

Referring to FIG. 1, the storage device SD1 may include a nonvolatile memory (NVM) 10 and a controller 20. The nonvolatile memory 10 may include first and second memory chips 100 and 200. The nonvolatile memory 10 may include a plurality of nonvolatile memory chips including at least the first and second memory chips 100 and 200, and thus, the nonvolatile memory 10 may be referred to as a multi-chip memory. For example, each of the first and second memory chips 100 and 200 may be a dual die package (DDP) or a quadruple die package (QDP). In an embodiment, each of the first and second memory chips 100 and 200 may be a NAND flash memory chip. However, inventive concepts are not limited thereto. For example, at least one of the first and second memory chips 100 and 200 may be or may include be a resistive memory chip such as a resistive RAM (ReRAM) or a phase change RAM (PCRAM).

The nonvolatile memory 10 and the controller 20 may communicate with each other through first to third signal lines SL1 to SL3. A clock signal CLK may be transmitted through the first signal line SL1. The first signal line SL1 may be referred to as a clock signal line. In the example embodiment, the clock signal CLK may toggle at a desired (or, alternatively, predetermined) frequency in a specific period, and accordingly, the storage device SD1 may be an asynchronous system. For example, the clock signal CLK may toggle at a frequency corresponding to a data input/output speed. A data strobe signal DQS may be transmitted through the second signal line SL2. The second signal line SL2 may be referred to as a data strobe signal line. A command and an address may be transmitted through the third signal lines SL3, and then data DQ may be transmitted. Accordingly, the third signal lines SL3 may be referred to as input/output lines or data lines.

The nonvolatile memory 10 may include first to third pins P1 to P3. The first and second memory chips 100 and 200 may be commonly connected to each of the first to third pins P1 to P3. The first to third pins P1 to P3 may be referred to as first to third pads. The first pin P1 may be connected to the first signal line SL1 and may be referred to as a clock pin. The second pin P2 may be connected to the second signal line SL2. The third pins P3 may be connected to the third signal lines SL3 respectively. Hereinafter, the second and third pins P2 and P3 may be referred to as input/output pins. The controller 20 may include first to third pins P1' to P3' connected to the first to third signal lines SL1 to SL3, respectively.

When a read operation is performed with respect to the nonvolatile memory 10, the nonvolatile memory 10 may receive the clock signal CLK, for example, indicating a read enable signal, and output the data strobe signal DQS and data DQ. In a double data rate (DDR) mode, the data DQ may be output, e.g. sequentially output, in synchronization with both a rising edge and a falling edge of the data strobe signal DQS. Therefore, data windows of output first and second data may respectively correspond to a logic high period and a logic low period of the data strobe signal DQS. At this time, since the data strobe signal DQS is generated based on the clock signal CLK, the data windows of the first and second data may be determined according to a ratio, for example, a duty ratio, of the logic high period and the logic low period of the clock signal CLK.

When a duty mismatch occurs in the clock signal CLK, the logic high period and the logic low period of the clock signal CLK, for example a length of the logic high period and a length of the logic low period, may be different from each other, that is, the ratio between the logic high period and the logic low period may not be 1:1. At this time, the first and second data may have different data windows, and effective data windows of the first and second data may be reduced. This may result in degradation of the performance of the nonvolatile memory 10. Therefore, securing a more effective data window by performing duty correction on the clock signal CLK in order to solve or improve upon the duty mismatch of the clock signal CLK may be desired or required The first memory chip 100 may include a duty correction circuit (DCC) 120 and an output buffer 140. The second memory chip 200 may include a DCC 220 and an output buffer 240. The DCCs 120 and 220 may perform in parallel a duty correction operation on the clock signal CLK so as to reduce or improve upon the duty mismatch of the clock signal CLK. The output buffers 140 and 240 may respectively buffer outputs of the DCCs 120 and 220 and may be coupled to the second or third pin P2 or P3. In an example embodiment, if the output buffers 140 and 240 are data strobe signal output buffers, the output buffers 140 and 240 may be coupled to the second pin P2. In an example embodiment, if the output buffers 140 and 240 are data signal output buffers, the output buffers 140 and 240 may be coupled to the third pin P3.

Since the nonvolatile memory 10 is an asynchronous system and there is no frequency that is always toggling, the DCCs 120 and 220 may perform the duty correction operation only in a period in which the clock signal CLK is applied. In an example embodiment, the nonvolatile memory 10 may perform the duty correction operation using the read enable signal as the clock signal CLK. If the duty correction operation is performed in a readout period in which readout data is output in a readout period in which the read operation on the nonvolatile memory 10 is performed, a clock duty may be changed in each clock cycle by the duty correction operation, and thus the effective data window of the readout data may be reduced.

Thus, in an example embodiment, the DCCs 120 and 220 may perform the duty correction operation in a dedicated period other than the readout period. Hereinafter, the dedicated period of the duty correction operation will be referred to as a DCC training period, and an operation of the DCCs 120 and 220 performed in the DCC training period will be referred to as DCC training. In an example embodiment, the DCC training period may include a desired (or, alternatively, predetermined) number of clock cycles. During the DCC training period, the clock signal CLK, e.g., the read enable signal, may toggle at a desired (or, alternatively, predetermined) frequency regardless of the operation of the output buffers 140 and 240.

In an example embodiment, the DCC training may be performed during a read latency period of the read period before the readout period. In an example embodiment, the DCC training may be performed during a power up period where power is applied to the storage device SD1. If the DCC training is performed, e.g. sequentially performed, in the DCCs 120 and 220, the DCC training period considerably increases. If the number of memory chips included in the nonvolatile memory 10 is m, and the DCC training period for each memory chip is A, the entire DCC training period of the nonvolatile memory 10 is m*A. Therefore, as the number of the memory chips included in the nonvolatile memory 10 increases, the entire DCC training period may increase, thereby deteriorating the performance of the nonvolatile memory 10. However, according to the example embodiment, the DCCs 120 and 220 perform the DCC training in parallel, and thus the entire DCC training period may be constant even when more than m memory chips are included in the nonvolatile memory 10, thereby preventing the performance of the nonvolatile memory 10 from deteriorating.

In some embodiments, the storage device SD1 may be an internal memory embedded in an electronic device. For example, the storage device SD1 may be an SSD, an embedded universal flash storage (UFS) memory device, or an embedded multi-media card (eMMC). In some embodiments, the storage device SD1 may be an external memory removable from the electronic device. For example, the storage device SD1 may be a UFS memory card, compact flash (CF), secure digital (SD), micro secure digital (SD), mini secure digital (SD) or a memory stick.

Figure 2:
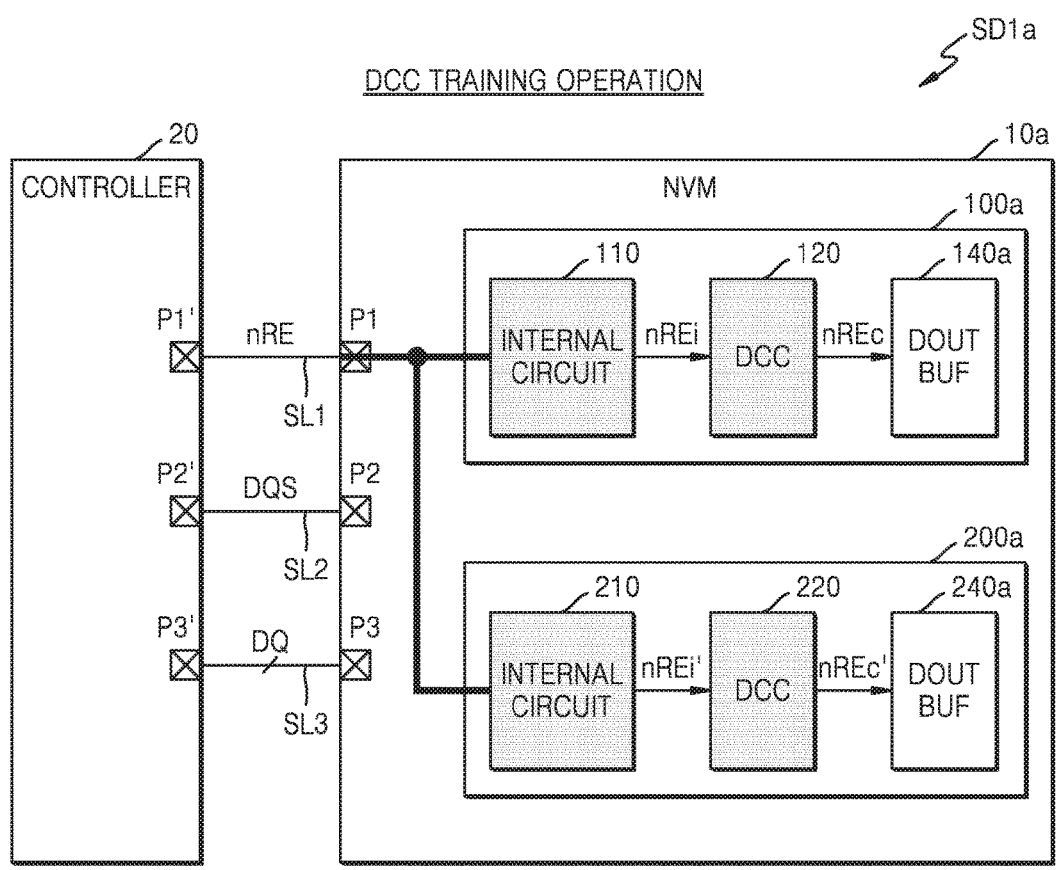
FIG. 2 is a block diagram illustrating a duty correction circuit (DCC) training operation of an example of the storage device of FIG. 1.
Figure 3:
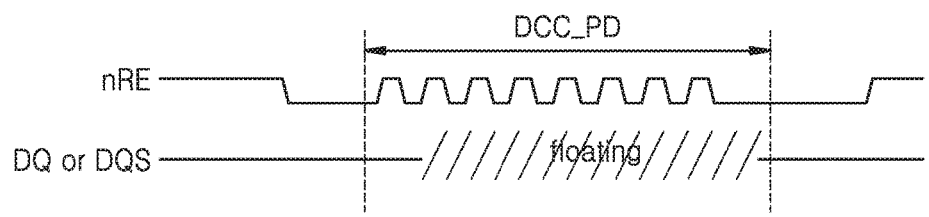
FIG. 3 is a timing diagram illustrating a DCC training operation performed by a storage device of FIG. 2.

FIG. 2 is a block diagram illustrating a DCC training operation of an example SD1a of the storage device of FIG. 1. FIG. 3 is a timing diagram illustrating a DCC training operation performed by the storage device SD1a of FIG. 2.

Referring to FIGS. 2 and 3, the storage device SD1a may include a nonvolatile memory 10a and a controller 20. The nonvolatile memory 10a may include first and second memory chips 100a and 200a. The first memory chip 100a may include an internal circuit 110, a DCC 120, and an output buffer 140a. The second memory chip 200a may include an internal circuit 210, a DCC 220, and an output buffer 240a.

During a DCC training period DCC_PD, the nonvolatile memory 10a may receive an external clock signal, e.g., a read enable signal nRE, from the controller 20 through the first pin P1. The read enable signal nRE may toggle at a desired (or, alternatively, predetermined) frequency during the DCC training period DCC_PD. Hereinafter, an example embodiment in which the external clock signal is the read enable signal nRE will be described. However, inventive concepts are not limited thereto. The external clock signal may be one of various control signals indicating an operation of the nonvolatile memory 10a. In some embodiments, the data strobe signal DQS may be used as the clock signal CLK.

The internal circuit 110 may receive the read enable signal nRE and generate an internal read enable signal nREi during the DCC training period DCC_PD. The internal circuit 110 is collectively referred to as a transfer path of the read enable signal nRE in the first memory chip 100a until the read enable signal nRE is input to the DCC 120 after being received by the first memory chip 100a, and may be referred to as a clock distribution circuit. Even if a duty mismatch does not occur in the read enable signal nRE received in the internal circuit 110, as the read enable signal nRE is transmitted through the internal circuit 110, the duty mismatch does may occur in the internal read enable signal nREi. Thus, the DCC 120 may be disposed in a final stage of an internal clock signal path.

The DCC 120 may perform a duty correction operation on the internal read enable signal nREi during the DCC training period DCC_PD to generate a read enable signal nREc whose duty is corrected (hereinafter referred to as a corrected read enable signal). The output buffer 140a may be disabled during the DCC training period DCC_PD. Specifically, an output of the output buffer 140a is a tri-state, that is, a high impedance (Hi-Z) state. The output buffer 140a may not be electrically connected to the second or third pin P2 or P3. The second or third pin P2 or P3 may be electrically floated.

The internal circuit 210 may receive the read enable signal nRE and generate an internal read enable signal nREi' during the DCC training period DCC_PD. Since elements included in the internal circuits 110 and 210 may be different from each other, although the internal circuits 110 and 210 receive the same read enable signal nRE, the internal circuits 110 and 210 may generate the different internal read enable signals nREi and nREi' respectively. The DCC 220 may perform a duty correction operation on the internal read enable signal nREi', thereby generating a corrected read enable signal nREc'. The DCCs 120 and 220 may perform the duty correction operation in parallel with each other and may perform the duty correction operation at substantially the same time. The output buffer 240a may be disabled during the DCC training period DCC_PD. Specifically, the output of the output buffer 240a is in the tri-state, that is, in the high impedance (Hi-Z) state. The output buffer 240a may not be electrically connected to the second or third pins P2 or P3. The second or third pin P2 or P3 may be floated.

According to the example embodiment, during the DCC training period DCC_PD, the outputs of the DCCs 120 and 220 may not be provided to the controller 20 because the output buffers 140a and 240a are disabled. Accordingly, the DCC training period DCC_PD may be reduced because a readout period is removed from the DCC training period DCC_PD. Further, since securing the readout period in the DCC training period DCC_PD may not be necessary, the DCCs 120 and 220 may perform the duty correction operation in parallel. Therefore, even if the number of memory chips included in the nonvolatile memory 10a increases, the entire DCC training period may be maintained constant regardless of the number of the memory chips. Further, since the output buffers 140a and 240a are disabled, current consumption and/or power consumption in a DCC training operation may be reduced.

Figure 4:
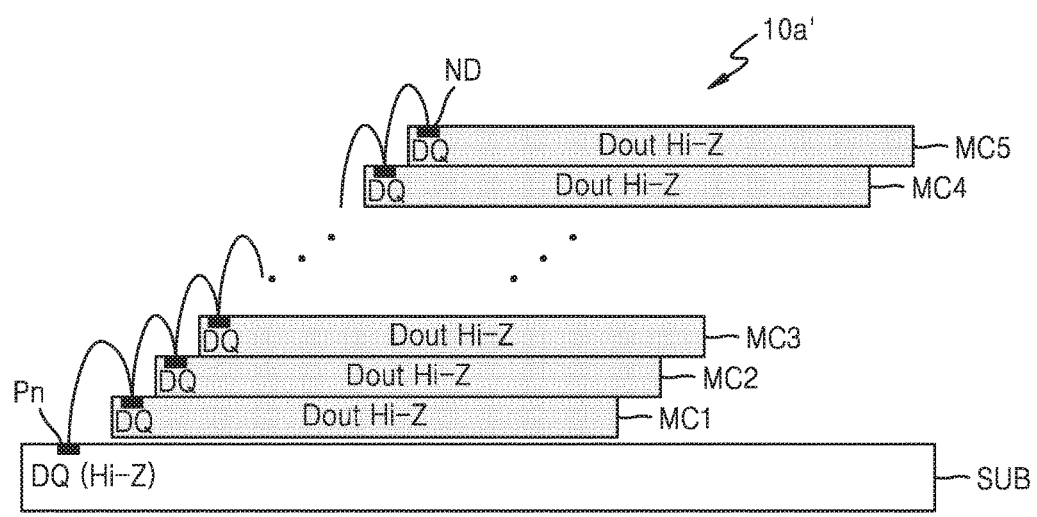
FIG. 4 shows an example of a nonvolatile memory of FIG. 2 according to an example embodiment of inventive concepts.

FIG. 4 shows an example 10*a*' of a nonvolatile memory of FIG. 2 according to an example embodiment of inventive concepts.

Referring to FIG. 4, the nonvolatile memory 10*a*' may include a substrate SUB and a plurality of memory chips MC1 to MC5. The plurality of memory chips MC1 to MC5 may be vertically stacked on the substrate SUB. Input/output pins Pn may be disposed on the substrate SUB. Input/output nodes ND of the plurality of memory chips MC1 to MC5 may be connected to the input/output pins Pn. For example, the input/output pins Pn and the input/output nodes ND may be connected to each other by wire bonding. At this time, for wire bonding, the plurality of memory chips MC1 to MC5 may be stacked to have a skew in a horizontal direction.

Figure 5:
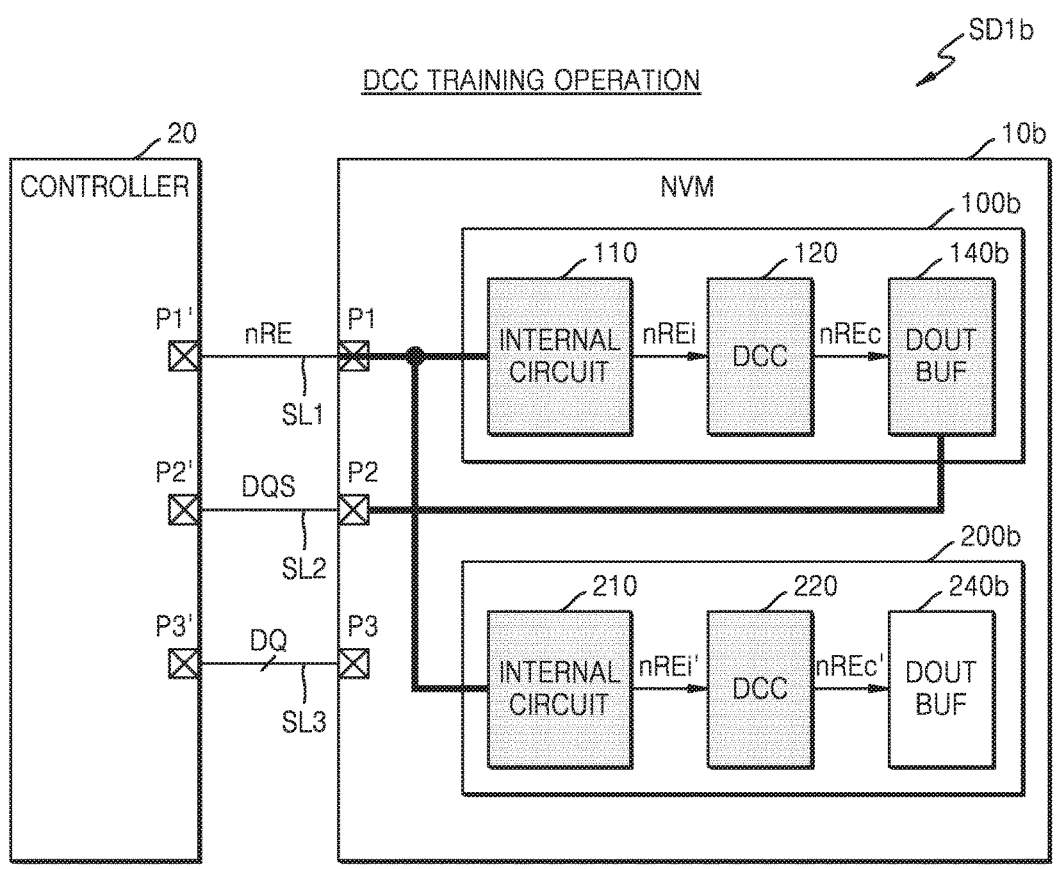
FIG. 5 is a block diagram illustrating a DCC training operation of an example of a storage device of FIG. 1.
Figure 6:
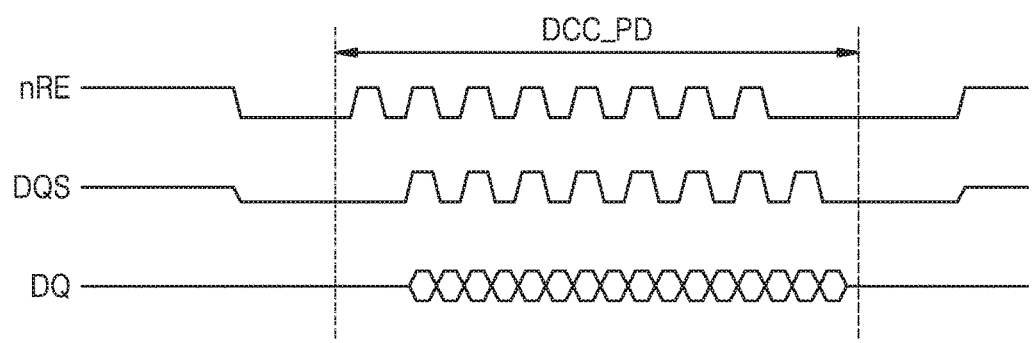
FIG. 6 is a timing diagram illustrating a DCC training operation performed by a storage device of FIG. 5.

In an example embodiment, during the DCC training period, output buffers included in the plurality of memory chips MC1 to MC5 may be all in the high impedance state Hi-Z. The output buffers of the plurality of memory chips MC1 to MC5 ND may not be electrically connected to the input/output pins Pn. Accordingly, the data DQ or the data strobe signal DQS may not be outputted from the plurality of memory chips MC1 to MC5, and the input/output pin Pn may be floated. FIG. 5 is a block diagram illustrating a DCC training operation of an example SD1*b* of a storage device of FIG. 1. FIG. 6 is a timing diagram illustrating the DCC training operation performed by the storage device SD1*b* of FIG. 5.

Referring to FIGS. 5 and 6, the storage device SD1*b* may include a nonvolatile memory 10*b* and a controller 20. The nonvolatile memory 10*b* may include first and second memory chips 100*b* and 200*b*. The first memory chip 100*b* may include the internal circuit 110, the DCC 120 and an output buffer 140*b*. The second memory chip 200*b* may include the internal circuit 210, the DCC 220, and an output buffer 240*b*.

The output buffer 140*b* may be enabled during the DCC training period DCC_PD and may be electrically coupled to the second or third pin P2 or P3. Thus, an output of the DCC 120, e.g., the corrected read enable signal nREc, may be communicated to the controller 20 through the second or third pin P2 or P3. Meanwhile, the output buffer 240*b* may be disabled during the DCC training period DCC_PD. Specifically, the output of the output buffer 240*b* is in a tri-state, for example, in the high impedance Hi-Z state. The output buffer 240*b* may not be electrically connected to the second or third pin P2 or P3. The second or third pin P2 or P3 may be floated. Therefore, the output of the DCC 220, that is, the corrected read enable signal nREc', may not be transmitted to the controller 20.

The controller 20 may receive an output of the output buffer 140*b* through the second or third signal line SL2 or SL3, thereby monitoring a duty correction operation on the nonvolatile memory 10*b*. In an example embodiment, the controller 20 may determine an end time of the duty correction operation based on a monitoring result and send a duty correction end command or a set feature command to the nonvolatile memory 10*b* at the determined end time. However, inventive concepts are not limited thereto. The controller 20 may transmit the duty correction end command or the set feature command to the nonvolatile memory 10*b* when the DCC training period corresponding to a desired (or, alternatively, predetermined) number of clock cycles ends.

According to the example embodiment, since only one of the output buffers 140*b* and 240*b* is enabled during the DCC training period DCC_PD, only an output of one of the DCCs 120 and 220 may be provided to the controller 20. Accordingly, since only a readout period for one memory chip is required in the DCC training period DCC_PD, the DCC training period DCC_PD may be reduced compared to the case where the readout period for all memory chips is required. Further, since only the readout period for one memory chip is required in the DCC training period DCC_PD, the DCCs 120 and 220 may perform the duty correction operation in parallel. Therefore, even if the number of memory chips included in the nonvolatile memory 10*b* increases, a time of the entire DCC training period may be maintained constant or close to constant regardless of the number of the memory chips. Furthermore, since only one of the output buffers 140*b* and 240*b* is enabled, current consumption and/or power consumption in the DCC training operation may be reduced.

Figure 7:
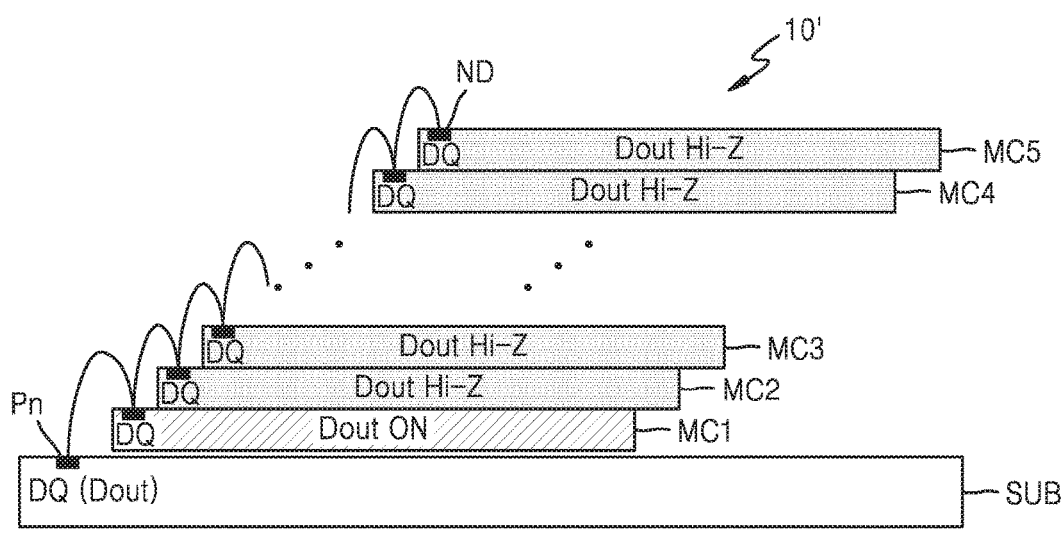
FIG. 7 shows an example of a nonvolatile memory of FIG. 5 according to an example embodiment of inventive concepts.

FIG. 7 shows an example 10*b*' of a nonvolatile memory of FIG. 5 according to an example embodiment of inventive concepts. The nonvolatile memory 10*b*' according to the example embodiment corresponds to a modified embodiment of the nonvolatile memory 10*a*' of FIG. 4, and a redundant description will be omitted.

Referring to FIG. 7, the nonvolatile memory 10*b*' may include the substrate SUB and the plurality of memory chips MC1 to MC5. In an example embodiment, during the DCC training period, only an output buffer included in the first memory chip MC1 of the plurality of memory chips MC1 to MC5 is enabled, and output buffers included in the remaining memory chips MC2 to MC5 are all in the high impedance Hi-Z state. Therefore, only the input/output node ND of the first memory chip MC1 may be electrically connected to the input/output pin Pn, and the input/output nodes ND of the remaining memory chips MC2 to MC5 may not be electrically connected to the input/output pins Pn. Accordingly, only the data DQ, that is, Dout or the data strobe signal DQS output from the first memory chip MC1 may be transferred to the input/output pins Pn.

Figure 8:
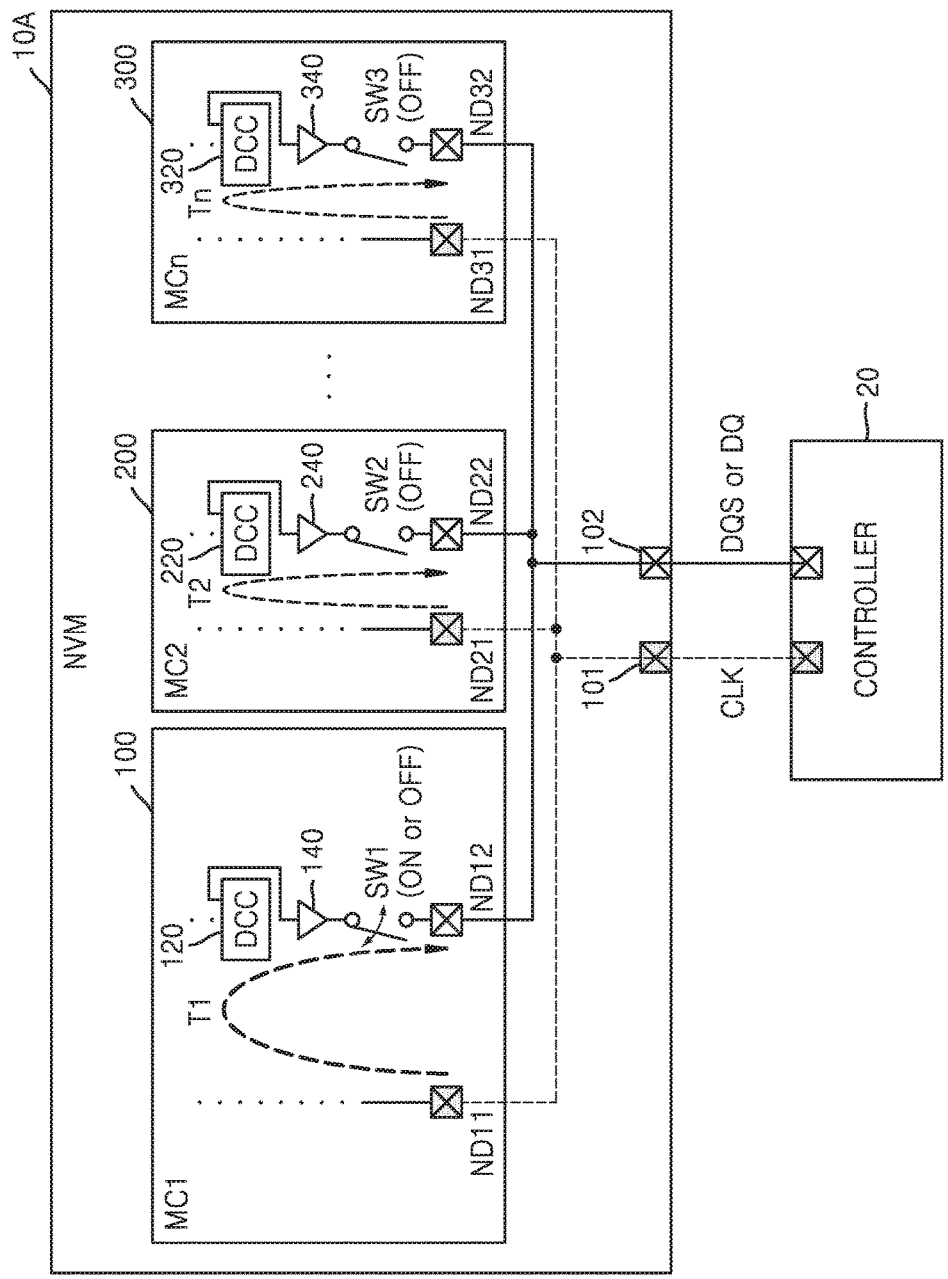
FIG. 8 is a detailed block diagram showing a nonvolatile memory according to an example embodiment of inventive concepts.

FIG. 8 is a detailed block diagram showing a nonvolatile memory 10A according to an example embodiment of inventive concepts. The nonvolatile memory 10A may be an example of the nonvolatile memory 10 of FIG. 1.

Referring to FIG. 8, the nonvolatile memory 10A may include a clock pin 101, an input/output pin 102, and a plurality of memory chips 100, 200, and 300. The nonvolatile memory 10A may receive the external clock signal CLK, e.g., corresponding to a read enable signal, from the controller 20 through the clock pin 101 and may provide the data strobe signal DQS or the data DQ to the controller 20 through the input/output pin 102. For example, the clock pin 101 may correspond to the first pin P1 of FIG. 1, and the input/output pin 102 may correspond to the second pin P2 or the third pin P3 of FIG. 1.

The first memory chip 100 may include a first node ND11 configured to be connected to the clock pin 101 and a second node ND12 configured to be connected to the input/output pin 102. The first memory chip 100 may receive the external clock signal CLK through the first node ND11. A duty mismatch may occur in a transfer path (hereinafter, referred to as a clock signal path) of the external clock signal CLK input to the first memory chip 100, and thus the DCC 120 may be disposed in a last stage of the clock signal path in the first memory chip 100.

The DCC 120 may perform a duty correction operation on an internal clock signal based on the external clock signal CLK. The output buffer 140 may buffer an output of the DCC 120. In an example embodiment, a switch SW1 may be turned on, and an output of the output buffer 140 may be coupled to the second node ND12 and may be provided to the input/output pin 102 through the second node ND12. In an example embodiment, the switch SW1 may be turned off and the output of the output buffer 140 may not be coupled to the second node ND12. Configurations and operations of the second and nth memory chips 200 and 300 may be substantially similar to the first memory chip 100. In an example embodiment, the switches SW2 and SW3 may all be turned off and the outputs of the output buffers 240 and 340 may not be connected to the second nodes ND22 and ND32, respectively.

In the first memory chip 100 a first time T1 may be taken from time when the external clock signal CLK is input through the first node ND11 to time when an output signal is output through the second node ND12. In the second memory chip 200, a second time T2 may be taken from time when the external clock signal CLK is input through a first node ND21 to time when the output signal is output through a second node ND22. In the nth memory chip 300, a nth time Tn may be taken from time when the output signal is output through a first node ND31 to time when the output signal is output through a second node ND32. At this time, the internal configurations of the first to nth memory chips 100 to 300 may be different, and the first to nth times T1 to Tn may be different from each other. Therefore, a limitation condition that the DCC training is sequentially performed in the first to nth memory chips 100 to 300 may occur.

However, according to the example embodiment, the output buffers 140, 240, and 340 of the first to nth memory chips 100 to 300 are all disabled or only one of the output buffers 140, 240, and 340 of the first to nth memory chips 100 to 300 is enabled, and thus DCC training may be performed in parallel in the first to nth memory chips 100 to 300 without considering a readout period in the DCC training period.

Figure 9:
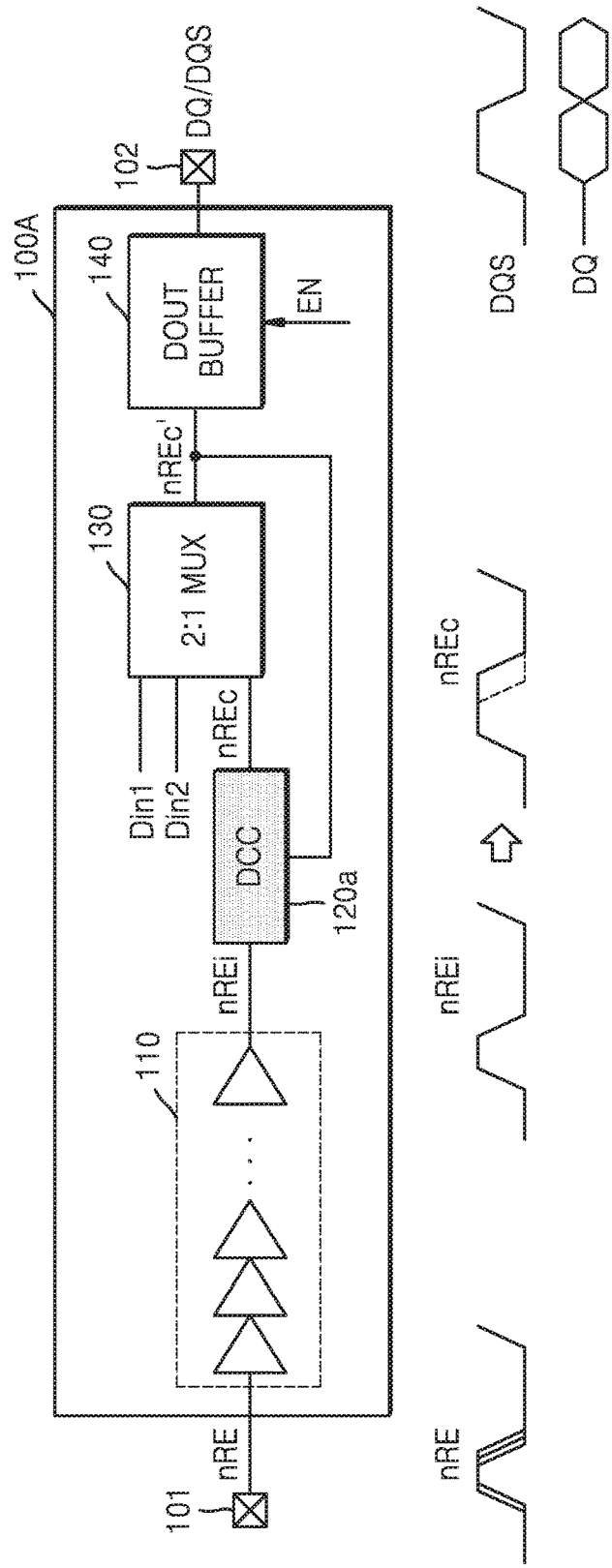
FIG. 9 is a block diagram illustrating an example of a memory chip according to an example embodiment of inventive concepts.

FIG. 9 is a block diagram illustrating an example 100A of a memory chip according to an example embodiment of inventive concepts.

Referring to FIG. 9, the memory chip 100A may include the internal circuit 110, the DCC 120a, a multiplexer 130, and the output buffer 140. The internal circuit 110 may receive the read enable signal nRE and generate the internal read enable signal nREi based on the received read enable signal nRE. For example, the internal circuit 110 may include a plurality of inverters, for example, an even number of inverters. When a duty mismatch occurs in the read enable signal nRE, the duty mismatch may also occur in the internal read enable signal nREi. However, even if the duty mismatch does not occur in the read enable signal nRE, the duty mismatch may occur in the internal enable signal nREi while passing through the internal circuit 110.

The DCC 120a may generate the corrected read enable signal nREc by performing a duty correction operation on the internal read enable signal nREi. The DCC 120a may remove the duty mismatch occurred in the internal read enable signal nREi, and thus a duty ratio of the corrected read enable signal nREc may be, e.g. may be close to, 1:1. According to an example embodiment, the DCC 120a may have various configurations for performing the duty correction operation. The configuration and operation of the DCC 120a described herein are examples and inventive concepts are not limited thereto.

The multiplexer 130 may receive first and second internal data Din1 and Din2 and generate an output signal nREc' from the first and second internal data Din1 and Din2 according to the corrected read enable signal nREc. In an example embodiment, the memory chip 100A may further include a random data generator that may generate the first and second internal data Din1 and Din2. In an example embodiment, the memory chip 100A may further include a register. The first and second internal data Din1 and Din2 may be data previously stored in a register. For example, the first internal data Din1 may be logic '1' and the second internal data Din2 may be logic '0'. The multiplexer 130 may output the first internal data Din1 in a logic high period of the corrected read enable signal nREc and the second internal data Din2 in a logic low period of the corrected read enable signal nREc, thereby generating the output signal nREc'.

However, in a path from the corrected read enable signal nREc output from the DCC 120a to the output signal nREc' output from the multiplexer 130, a duty mismatch of the output signal nREc' may occur. Thus, the memory chip 10A may have a feedback loop for detecting the duty mismatch of the output signal nREc'. Specifically, the output signal nREc' may be fed back to the DCC 120a. The DCC 120a may perform the duty correction operation on the output signal nREc'. Accordingly, a duty of the signal input to the output buffer 140 may be more accurately corrected.

The output buffer 140 may receive the output signal nREc' from the multiplexer 130 and may be enabled according to the enable signal EN. When the enable signal EN is activated, the output buffer 140 may be enabled and the output signal nREc' may be provided to the input/output pin 102. However, when the enable signal EN is deactivated, the output buffer 140 may be disabled, the output signal nREc' may not be provided to the input/output pin 102, and the input/output pin 102 may be floated.

Figure 10A:
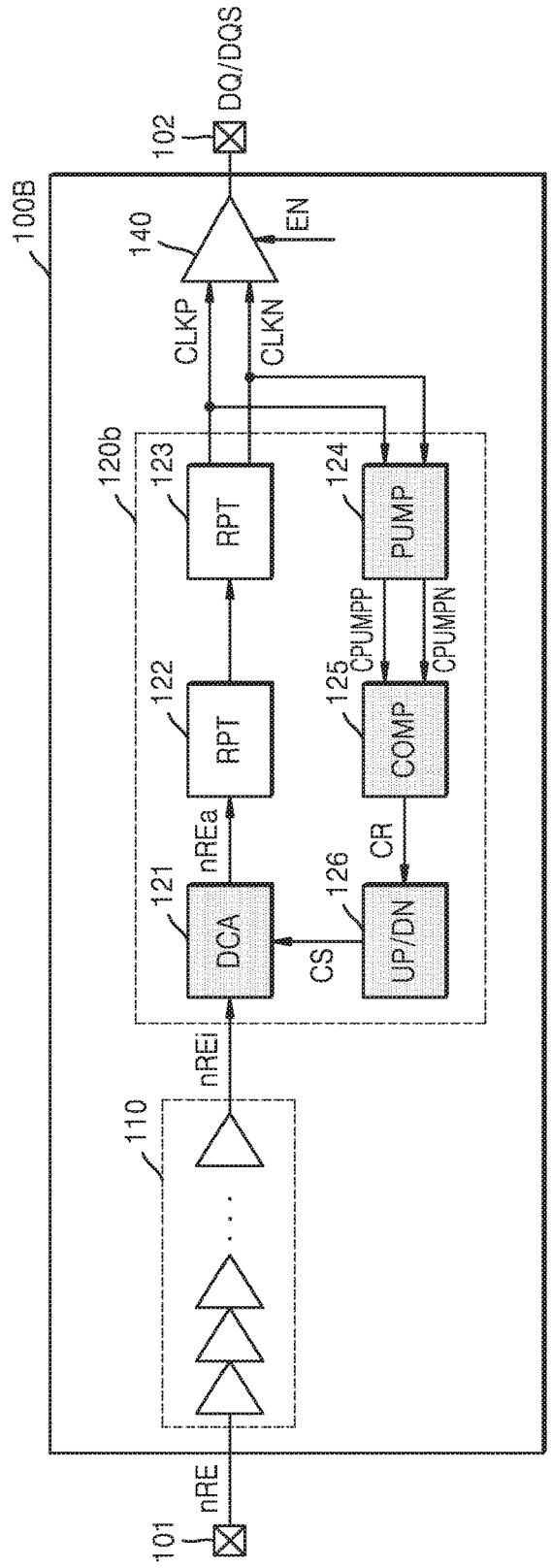
FIG. 10A is a block diagram showing another example of a memory chip according to an example embodiment of inventive concepts.
Figure 10B:
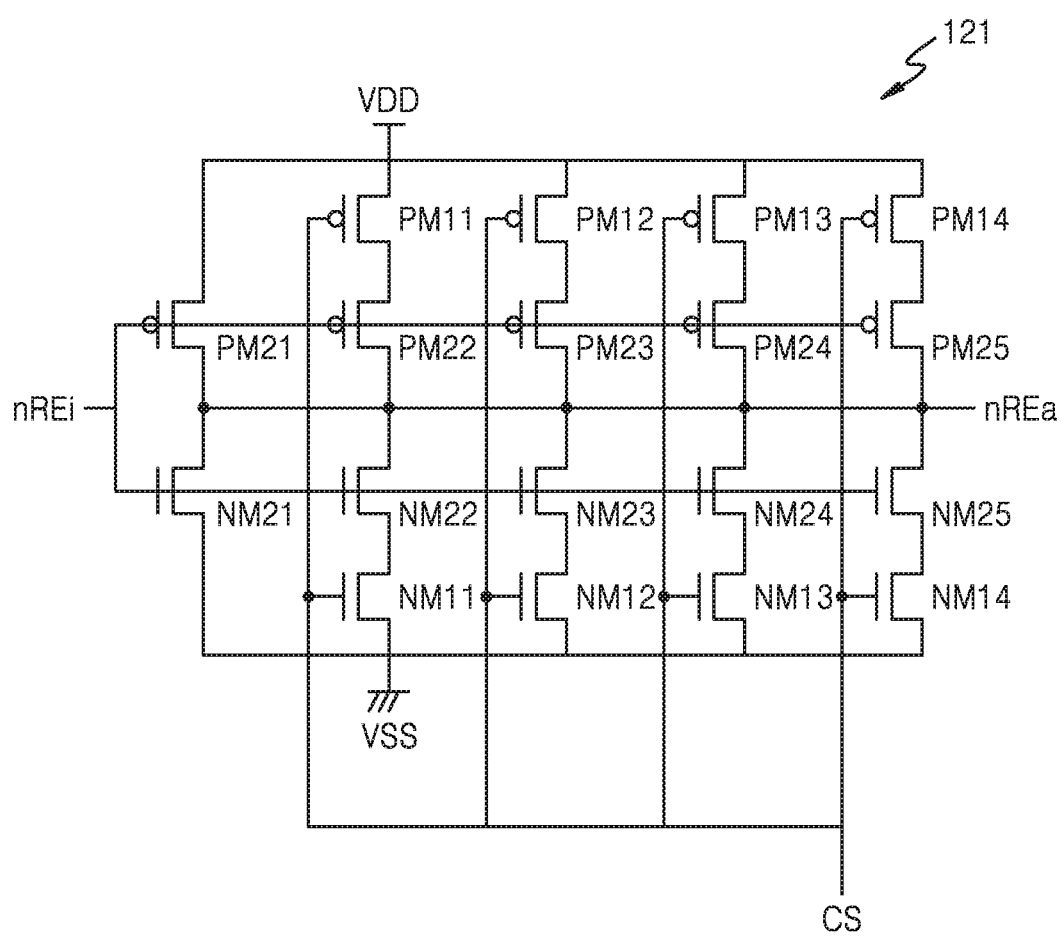
FIG. 10B is a circuit diagram showing a duty cycle adjustment (DCA) circuit included in the memory chip of FIG. 10A.

FIG. 10A is a block diagram showing another example of a memory chip 100B according to an example embodiment of inventive concepts. FIG. 10B is a circuit diagram showing a DCA circuit 121 included in the memory chip 100B of FIG. 10A. The memory chip 100B according to the example embodiment corresponds to a modified embodiment of the memory chip 100A of FIG. 9, and a redundant description is omitted.

Referring to FIG. 10A, the memory chip 100B may include the internal circuit 110, the DCC 120b, and the output buffer 140. The DCC 120b may include a duty cycle adjustment (DCA) circuit 121, first and second repeaters (RPTs) 122 and 123, a charge pump 124, a comparator COMP 125, and an up/down counter 126. The DCA circuit 121 may generate an adjusted read enable signal nREa by adjusting a duty cycle of the internal read enable signal nREi.

The first repeater 122 may receive the adjusted read enable signal nREa. The second repeater 123 may output the first and second clock signals CLKP and CLKN from an output of the first repeater 122. Each of the first and second clock signals CLKP and CLKN may have a duty ratio based on the adjusted read enable signal nREa. The second clock signal CLKN may have an inverse phase with respect to the first clock signal CLKP. However, inventive concepts are not limited thereto. In some embodiments, the second repeater 123 may output a clock signal and a reference signal based on the adjusted read enable signal nREa.

The charge pump 124 may generate first and second charge pump signals CPUMPP and CPUMPN, respectively, through charge pumping from the first and second clock signals CLKP and CLKN. For example, the first charge pump signal CPUMPP may increase in a logic high period of the first clock signal CLKP and may decrease in a logic low period of the first clock signal CLKP. Similarly, the second charge pump signal CPUMPN may increase in a logic high period of the second clock signal CLKN and decrease in a logic low period of the second clock signal CLKN. Therefore, when a duty mismatch occurs in the first and second clock signals CLKP and CLKN, the logic high period is relatively long in the first clock signal CLKP, and the logic high period is relatively short in the second clock signal CLKN, after a few clock cycles of the first and second clock signals CLKP and CLKN, the first charge pump signal CPUMPP may increase while the second charge pump signal CPUMPN may decrease.

The comparator 125 may compare the first and second charge pump signals CPUMPP and CPUMPN and generate a counting result signal CR. For example, if the first charge pump signal CPUMPP is greater than the second charge pump signal CPUMPN, the counting result signal CR may be generated to a logic high level, and if the first charge pump signal CPUMPP is not greater than the second charge pump signal, the counting result signal CR may be generated to a logic low level. The up/down counter 126 may generate a control signal CS from the counting result signal CR. For example, the control signal CS may be generated as a 4-bit digital code, and if the counting result signal CR is logic high, a code of the control signal CS may increase by 1, whereas if the counting result signal CR is logic low, the code of the control signal CS may decrease by 1.

Referring to FIGS. 10A and 10B, the DCA circuit 121 may include first PMOS transistors PM11 to PM14, second PMOS transistors PM21 to PM25, first NMOS transistors NM11 to NM14, and second NMOS transistors NM21 to NM25. The first PMOS transistors PM11 to PM14 may be commonly connected to a power voltage terminal VDD. The first NMOS transistors NM11 to NM14 may be commonly connected to a ground voltage terminal VSS. The first PMOS transistors PM11 to PM14 and the first NMOS transistors NM11 to NM14 may be driven by the control signal CS. The second PMOS transistors PM21 to PM25 and the second NMOS transistors NM21 to NM25 may be driven by the internal read enable signal nREi.

For example, the control signal CS may be the 4-bit digital code. For example, when the code of the control signal CS increases by 1, some of the first PMOS transistors PM11 to PM14 may be turned off, and some of the first NMOS transistors NM11 to NM14 may be turned on, and thus a logic high period of the adjusted internal read signal nREa may be reduced relative to the internal read signal nREi. For example, if the code of the control signal CS decreases by 1, some of the first PMOS transistors PM11 to PM14 may be turned on and some of the first NMOS transistors NM11 to NM14 may be turned off, and thus the logic high period of the adjusted internal read signal nREa may be increased compared to the internal read signal nREi.

Figure 11A:
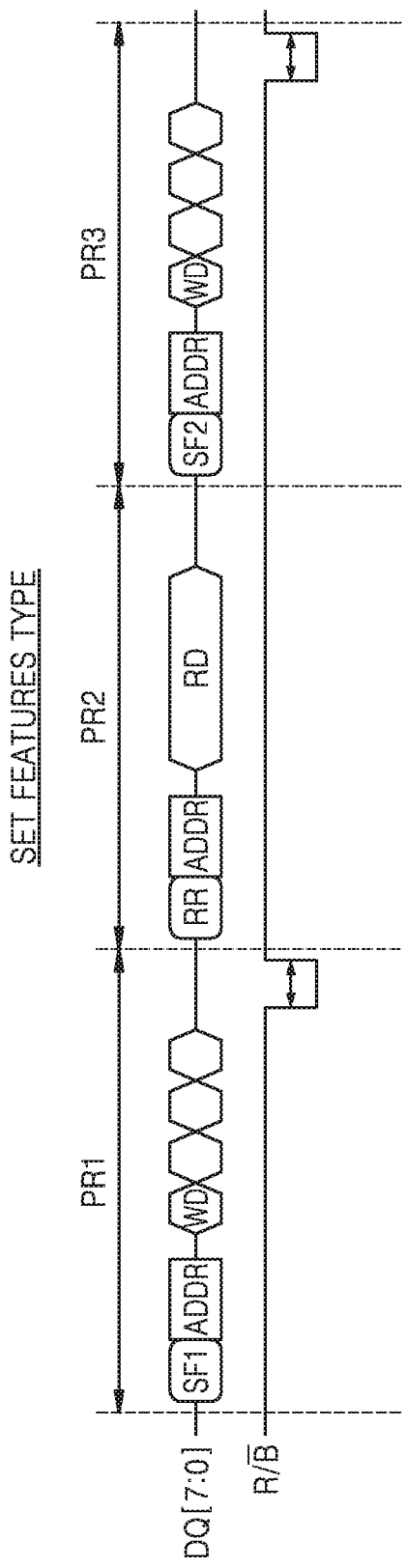
FIGS. 11A and 11B are timing diagrams each illustrating a duty correction sequence according to some embodiments of inventive concepts.
Figure 11B:
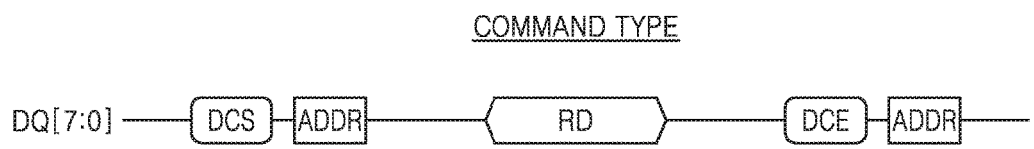

FIGS. 11A and 11B are timing diagrams each illustrating a duty correction sequence according to some embodiments of inventive concepts.

Referring to FIG. 11A, the duty correction sequence may be defined as a set feature type. A controller may issue a set feature command prior to a normal operation of a nonvolatile memory. Specifically, the set feature command is a command for setting features or operating conditions of the nonvolatile memory. In an example embodiment, a duty correction enable sequence may start by receiving the set feature command. Specifically, the duty correction sequence may include first through third periods PR1 through PR3.

In the first period PR1, a first set feature command SF1 and an address ADDR may be applied, e.g. sequentially applied, through a data line (for example, SL3 in FIG. 1), and then write data WD indicating a start of a duty correction operation may be transmitted. By the write data WD applied in the first period PR1, operating features of the nonvolatile memory may be corrected to the duty correction sequence from the normal operation. After the write data WD is transmitted, a ready/busy signal R/B̄ may be changed to a busy state.

In the second period PR2, a random read command RR and the address ADDR may be applied, e.g. sequentially applied, through the data line, and then random read data RD may be transmitted. In an example embodiment, the nonvolatile memory may include a random data generator and may output random data generated in a random data generator as random read data RD. In an example embodiment, the nonvolatile memory may include a register, and may output data previously stored in the register as the random read data RD.

In the third period PR3, a second set feature command SF2 and the address ADDR may be applied, e.g. sequentially applied, through the data line, and then the write data WD indicating an end of the duty correction operation may be applied. By the write data WD applied in the third period PR3, the operating features of the nonvolatile memory may be corrected to the normal operation from the duty correction sequence. After the write data WD is transmitted, the ready/busy signal RIB may be changed to the busy state.

Referring to FIG. 11B, the duty correction sequence may be defined as a command type. First, a duty correction start command DCS and the address ADDR may be applied, e.g. sequentially applied, through the data line, and thus the duty correction operation may start in the nonvolatile memory, and a DCC training period may start. At this time, the duty correction start command may be referred to as a duty correction enable command.

Then, the random read data RD through DCC training may be transmitted through the data line. Subsequently, a duty correction end command DCE and the address ADDR may be applied, e.g. sequentially applied, through the data line, and thus the duty correction operation may end in the nonvolatile memory and a DCC training period may end. At this time, the duty correction end command DCE may be referred to as a duty correction disable command.

During the duty correction sequence illustrated in FIG. 11A or 11B, a clock signal, e.g., a read enable signal, may be activated to toggle at a desired (or, alternatively, predetermined) frequency. After the duty correction sequence starts, the read enable signal toggles tens or hundreds of cycles depending on the DCC capability or operating environment of the nonvolatile memory. Using this toggling of the read enable signal, the DCC included in each memory chip may correct a duty mismatch that may occur in the internal read enable signal. However, after the duty correction sequence ends, the nonvolatile memory may start a normal read operation or a program operation. When the duty correction sequence ends, the DCC included in each memory chip may continue to provide a clock signal whose duty is corrected when a clock signal is input during a normal read operation or a program operation on the nonvolatile memory.

In an example embodiment, the duty correction sequence may be performed after a power up sequence in which power is applied to the nonvolatile memory. In an example embodiment, the duty correction sequence may be performed periodically in an idle state of the nonvolatile memory. In an example embodiment, the duty correction sequence may be performed in a part of a read latency period prior to a readout period during a read period of the nonvolatile memory.

Figure 12:
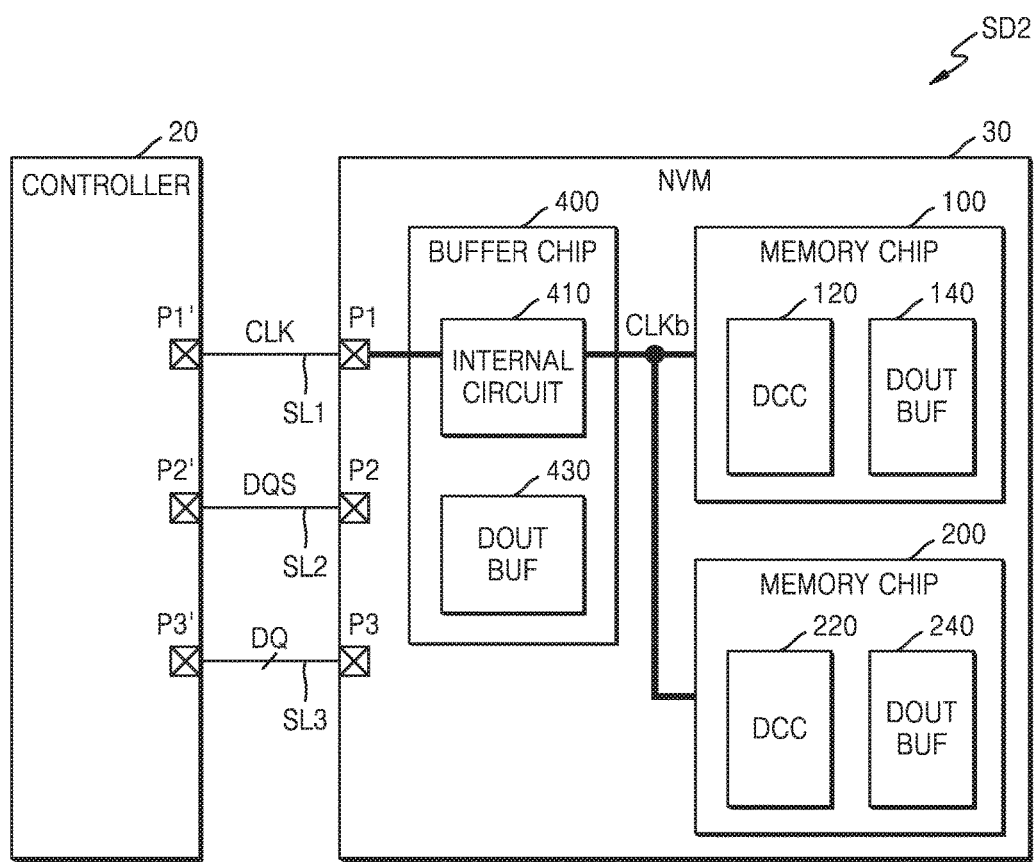
FIG. 12 is a block diagram schematically illustrating a storage device according to an example embodiment of inventive concepts.

FIG. 12 is a block diagram schematically illustrating a storage device SD2 according to an example embodiment of inventive concepts. The storage device SD2 according to the example embodiment corresponds to a modified embodiment of the storage device SD1 of FIG. 1, and descriptions provided with reference to FIGS. 1 to 11B may also be applied to the example embodiment.

Referring to FIG. 12, the storage device SD2 may include a nonvolatile memory 30 and a controller 20. The nonvolatile memory 30 may include first and second memory chips 100 and 200 and a buffer chip 400. The buffer chip 400 may be connected between the first to third pins P1 to P3 and the first and second memory chips 100 and 200 and may include an internal circuit 410 and an output buffer 430. The buffer chip 400 may also be referred to as a frequency boosting interface (FBI) circuit.

The internal circuit 410 may receive the external clock signal CLK through the first pin P1 and may buffer the received external clock signal CLK to generate a buffered clock signal CLKb. The internal circuit 410 may provide the buffered clock signal CLKb to the first and second memory chips 100 and 200. The output buffer 430 may buffer output signals of the first and second memory chips 100 and 200 and provide the buffered output signals to the controller 20 through the second or third pin P2 or P3.

In a DCC training period, the DCCs 120 and 220 may perform a duty correction operation in parallel on an internal clock signal based on the buffered clock signal CLKb. In an example embodiment, in the DCC training period, the output buffers 140 and 240 may all be disabled and outputs of the DCCs 120 and 220 may not be provided to the buffer chip 400 and the controller 20. At this time, DCC training may be performed in parallel on the first and second memory chips 100 and 200 included in the nonvolatile memory 30.

In an example embodiment, in the DCC training period, only one of the output buffers 140 and 240 may be enabled, for example, the output buffer 140 may be enabled. At this time, the output of the enabled output buffer 140 may be provided to the buffer chip 400. In an example embodiment, the output buffer 430 may be disabled, the output of the DCC 120 may not be provided to the controller 20, and the second or third pin P2 or P3 may be floating. In an example embodiment, the output buffer 430 may be enabled and the enabled output buffer 430 may buffer the output of the output buffer 140. At this time, the output of the output buffer 430 may be provided to the controller 20.

In an example embodiment, the buffer chip 400 may further include a DCC that may perform a duty correction operation on the output of the output buffer 140. At this time, DCC training may be performed on both the first and second memory chips 100 and 200 and the buffer chip 400 included in the nonvolatile memory 30. Hereinafter, an example embodiment in which the buffer chip 400 further may include a DCC will be described with reference to FIG. 13. Meanwhile, in an example embodiment, the first and second memory chips 100 and 200 may not include the DCCs 120 and 220, and only the buffer chip 400 may include the DCC.

Figure 13:
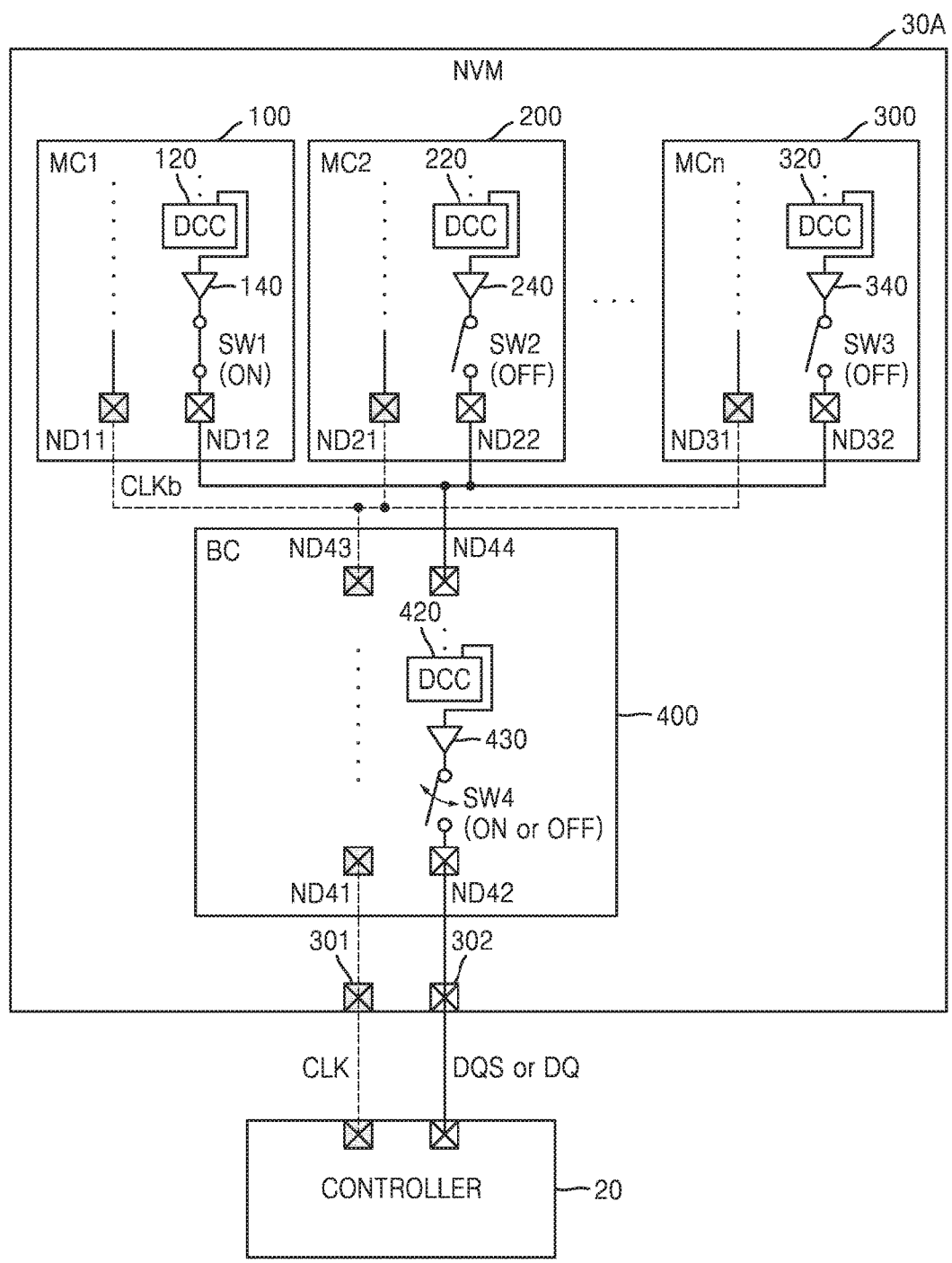
FIG. 13 is a detailed block diagram showing a nonvolatile memory according to an example embodiment of inventive concepts.

FIG. 13 is a detailed block diagram showing a nonvolatile memory 30A according to an example embodiment of inventive concepts. The nonvolatile memory 30A may be an example of the nonvolatile memory 30 of FIG. 12.

Referring to FIG. 13, the nonvolatile memory 30A may include a clock pin 301, an input/output pin 302, the plurality of memory chips 100, 200, and 300, and the buffer chip 400. The nonvolatile memory 30A may receive the external clock signal CLK, e.g., a read enable signal, from the controller 20 through the clock pin 301 and may provide the data strobe signal DQS or the data DQ to the controller 20 through the input/output pin 302. For example, the clock pin 301 may correspond to the first pin P1 of FIG. 1, and the input/output pin 302 may correspond to the second pin P2 or the third pin P3 of FIG. 1.

The buffer chip 400 may include a first node ND41 configured to be connected to the clock pin 301, a second node ND42 configured to be connected to the input/output pin 302, a DCC 420, an output buffer 430, and a switch SW4. Further, the buffer chip 400 may further include third and fourth nodes ND43 and ND44. The third node ND43 may be commonly connected to the first nodes ND11, ND21, and ND31 included in the plurality of memory chips 100 and 200, and 300, respectively. The fourth node ND44 may be commonly connected to the second nodes ND12, ND22, and ND32 included in the plurality of memory chips 100 and 200, and 300, respectively.

The buffer chip 400 may receive the external clock signal CLK through the first node ND41 and output the buffered clock signal CLKb through the third node ND32. The first, second and nth memory chips 100 and 200 and 300 may receive the buffered clock signal CLKb through the first nodes ND11, ND21 and ND31. The DCCs 120, 220 and 320 may perform a duty correction operation in parallel on an internal clock signal based on the buffered clock signal CLKb. The output buffers 140, 240, and 340 may buffer outputs of the corresponding DCCs 120, 220, and 320. In an example embodiment, only the switch SW1 among the switches SW1, SW2, and SW3 may be turned on, the output of the output buffer 140 may be coupled to the second node ND12 and may be provided to the fourth node ND44 of the buffer chip 400 through the second node ND12.

In the buffer chip 400, the DCC 420 may perform a duty correction operation on the output signal received from the output buffer 140 included in the first memory chip 100. The output buffer 430 may buffer an output of the DCC 420. In an example embodiment, the switch SW4 may be turned off and the output of the output buffer 430 may not be provided to the second node ND42. As a result, the input/output pin 302 may be floated, and the controller 20 may not receive the output of the output buffer 430.

In an example embodiment, the switch SW4 may be turned on and the output of the output buffer 430 may be provided to the input/output pin 302 through the second node ND42. Accordingly, the controller 20 may receive the output of the output buffer 430. The controller 20 may receive the output of the output buffer 430 and thus monitor a duty correction operation on the nonvolatile memory 30A. In an example embodiment, the controller 20 may determine end time of the duty correction operation based on a monitoring result and send a duty correction end command or a set feature command to the nonvolatile memory 30A at the determined end time. However, inventive concepts are not limited thereto. The controller 20 may transmit the duty correction end command or the set feature command to the nonvolatile memory 30A when a DCC training period corresponding to a desired (or, alternatively, predetermined) number of clock cycles ends.

The buffer chip 400 may cut off or separate capacitive loadings of the second nodes ND12, ND22 and ND32 of the plurality of memory chips 100 and 200 and 300 from capacitive loadings of the input/output pins 302 of the nonvolatile memory 30A. Accordingly, output data may swing quickly, and therefore, the data transfer performance of the nonvolatile memory 30A may be improved. The buffer chip 400 may also cut off or separate capacitive loadings of the first nodes ND11, ND21 and ND31 of the plurality of memory chips 100 and 200 and 300 from capacitive loading of the clock pin 301. Accordingly, the clock signal CLK may maintain signal integrity at high-speed operation.

Figure 14:
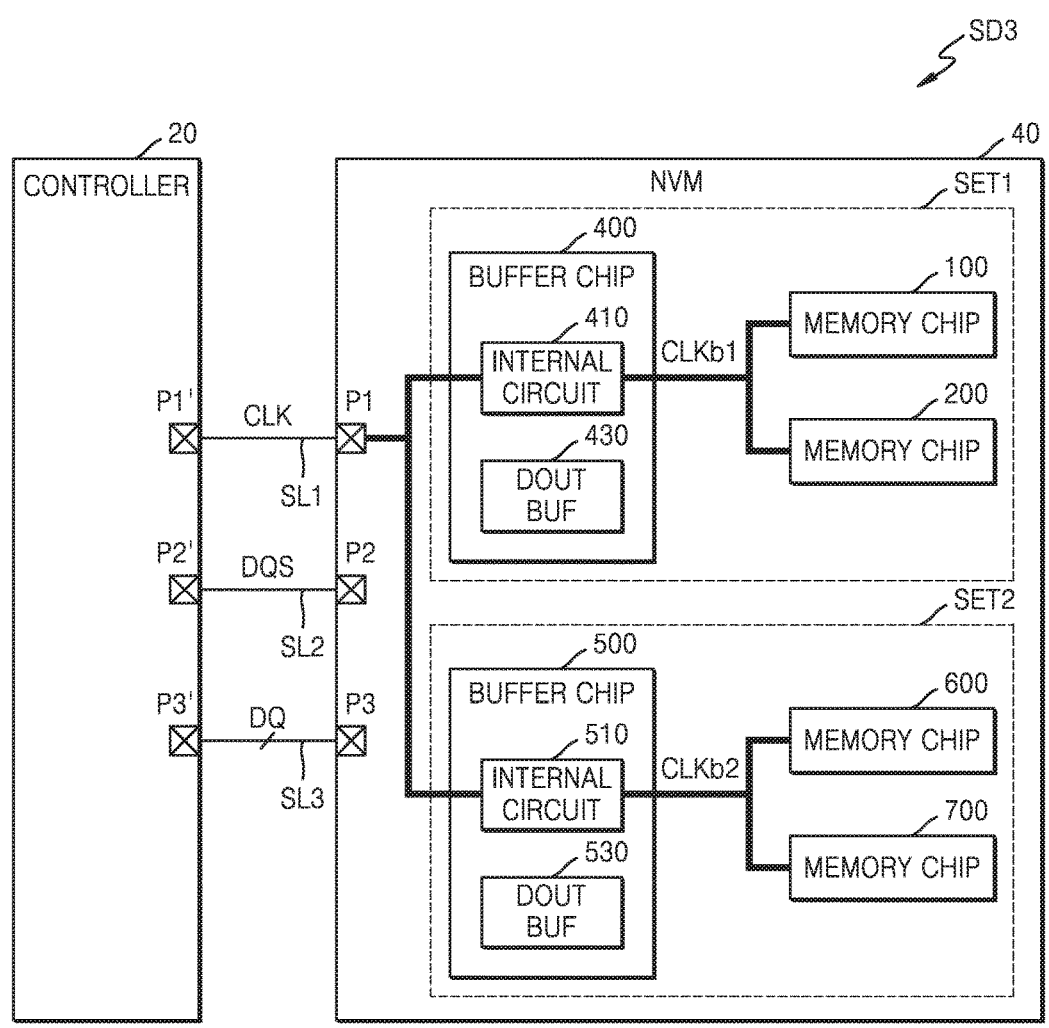
FIG. 14 is a block diagram schematically illustrating a storage device according to an example embodiment of inventive concepts.

FIG. 14 is a block diagram schematically illustrating a storage device SD3 according to an example embodiment of inventive concepts. The storage device SD3 according to the example embodiment corresponds to a modified embodiment of the storage device SD2 of FIG. 13, and descriptions provided with reference to FIGS. 1 to 14 may also be applied to the example embodiment.

Referring to FIG. 14, the storage device SD3 may include a nonvolatile memory 40 and the controller 20. The nonvolatile memory 40 may include the first and second memory chips 100 and 200, and first and second buffer chips 400 and 500. The first buffer chip 400 may be commonly connected to the first and second memory chips 100 and 200. The first buffer chip 400 and the first and second memory chips 100 and 200 may constitute a first set SET1. The second buffer chip 500 may be commonly connected to the third and fourth memory chips 600 and 700. The second buffer chip 500 and the third and fourth memory chips 600 and 700 may constitute a second set SET2.

The first buffer chip 400 may be connected between the first to third pins P1 to P3 and the first and second memory chips 100 and 200 and may include the internal circuit 410 and the output buffer 430. The internal circuit 410 may receive the external clock signal CLK through the first pin P1 and buffer the received external clock signal CLK to generate a first buffered clock signal CLKb1. The second buffer chip 500 may be connected between the first to third pins P1 to P3 and the third and fourth memory chips 600 and 700 and may include an internal circuit 510 and an output buffer 530. The internal circuit 510 may receive the external clock signal CLK through the first pin P1 and buffer the received external clock signal CLK to generate a second buffered clock signal CLKb2.

In a DCC training period, the first and second memory chips 100 and 200 may perform a duty correction operation in parallel on the internal clock signal based on the first buffered clock signal CLKb1, and the third and fourth memory chips 600 and 700 may perform the duty correction operation in parallel on the internal clock signal based on the second buffered clock signal CLKb2. For example, the first to fourth memory chips 100, 200, 600, and 700 may perform the duty correction operation at substantially the same time.

In an example embodiment, in the DCC training period, output buffers included in the first through fourth memory chips 100, 200, 600, and 700 may all be disabled. In an example embodiment, in the DCC training period, only the output buffer included in one of the first and second memory chips 100 and 200 may be enabled and only the output buffer included in one of the third and fourth memory chips 600 and 700 may only be enabled. In an example embodiment, in the DCC training period, the output buffers 430 and 530 may all be disabled. In an example embodiment, in the DCC training period, only one of the output buffers 430, 530 may be enabled.

In an example embodiment, each of the first and second buffer chips 400 and 500 may further include a DCC. The DCC included in the first buffer chip 400 may perform the duty correction operation on an output signal of one of the first and second memory chips 100 and 200. The DCC included in the second buffer chip 500 may perform the duty correction operation on an output signal of one of the third and fourth memory chips 600 and 700. At this time, DCC training may be performed on the first to fourth memory chips 100, 200, 600, and 700 and the first and second buffer chips 400 and 500 included in the nonvolatile memory 40. Hereinafter, an example embodiment in which the first and second buffer chips 400 and 500 further include a DCC will be described with reference to FIG. 15. Meanwhile, in an example embodiment, the first to fourth memory chips 100, 200, 600, and 700 do not include DCCs, and only the first and second buffer chips 400 and 500 may include a DCC.

Figure 15:
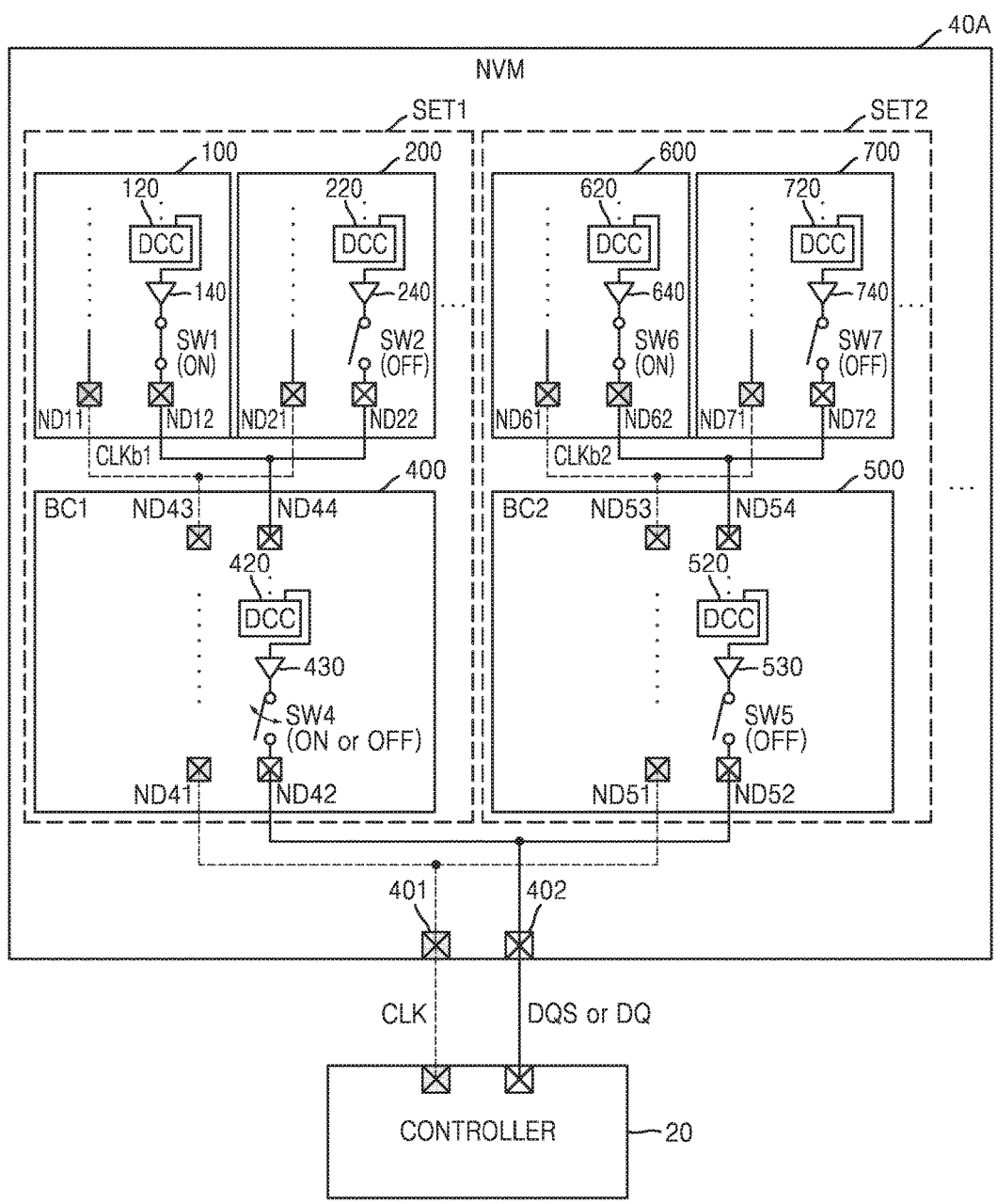
FIG. 15 is a detailed block diagram showing a nonvolatile memory according to an example embodiment of inventive concepts.

FIG. 15 is a detailed block diagram showing a nonvolatile memory 40A according to an example embodiment of inventive concepts. The nonvolatile memory 40A may be an example of the nonvolatile memory 40 of FIG. 14.

Referring to FIG. 15, the nonvolatile memory 40A may include a clock pin 401, an input/output pin 402, the plurality of memory chips 100, 200, 600, and 700, and first and second buffer chips 400 and 500. The nonvolatile memory 40A may receive the external clock signal CLK, e.g., a read enable signal, from the controller 20 through the clock pin 401 and may provide the data strobe signal DQS or the data DQ to the controller 20 through the input/output pin 402. For example, the clock pin 401 may correspond to the first pin P1 of FIG. 1, and the input/output pin 402 may correspond to the second pin P2 or the third pin P3 of FIG. 1.

The first buffer chip 400 may include the first node ND41 configured to be connected to the clock pin 401, the second node ND42 configured to be connected to the input/output pin 402, the DCC 420, the output buffer 430, and the switch SW4. Further, the first buffer chip 400 may further include the third and fourth nodes ND43 and ND44. The third node ND43 may be commonly connected to the first nodes ND11 and ND21 included in the plurality of memory chips 100 and 200. The fourth node ND44 may be commonly connected to the second nodes ND12 and ND22 included in the plurality of memory chips 100 and 200.

The first buffer chip 400 may receive the external clock signal CLK through the first node ND41 and output the first buffered clock signal CLKb1 through the third node ND43. The plurality of memory chips 100 and 200 may receive the first buffered clock signal CLKb1 through the first nodes ND11 and ND21. The DCCs 120 and 220 may perform a duty correction operation in parallel on an internal clock signal based on the first buffered clock signal CLKb1. The output buffers 140 and 240 may buffer outputs of the corresponding DCCs 120 and 220. In an example embodiment, only the switch SW1 among the switches SW1 and SW2 may be turned on. An output of the output buffer 140 may be coupled to the second node ND12 and the output of the output buffer 140 may be connected to the second node ND12 and may be provided to the fourth node ND44 of the first buffer chip 400 through the second node ND12.

In the first buffer chip 400, the DCC 420 may perform a duty correction operation on an output signal received from the output buffer 140 included in the memory chip 100. The output buffer 430 may buffer the output of the DCC 420. In an example embodiment, the switch SW4 may be turned on and the output of the output buffer 430 may be provided to the input/output pin 302 through the second node ND42. Accordingly, the controller 20 may receive the output of the output buffer 430. In an example embodiment, the switch SW4 may be turned off and the output of the output buffer 430 may not be provided to the second node ND42. Accordingly, the input/output pin 402 may be floated, and the controller 20 may not receive the output of the output buffer 430.

The second buffer chip 500 may include a first node ND51 configured to be connected to the clock pin 401, a second node ND52 configured to be connected to the input/output pin 402, a DCC 520, an output buffer 530, and a switch SW5. Further, the second buffer chip 500 may further include third and fourth nodes ND53 and ND54. The third node ND53 may be commonly connected to first nodes ND61 and ND71 included in the plurality of memory chips 600 and 700. The fourth node ND54 may be commonly connected to second nodes ND62 and ND72 included in the plurality of memory chips 600 and 700.

The second buffer chip 500 may receive the external clock signal CLK through the first node ND51 and output the second buffered clock signal CLKb2 through the third node ND53. The plurality of memory chips 600 and 700 may receive the second buffered clock signal CLKb2 through the first nodes ND61 and ND71. DCCs 620 and 720 may perform a duty correction operation in parallel on an internal clock signal based on the second buffered clock signal CLKb2. Output buffers 640 and 740 may buffer outputs of the corresponding DCCs 620 and 720. In an example embodiment, only the switch SW6 among the switches SW6 and SW7 may be turned on. The output of the output buffer 640 may be connected to the second node ND62 and may be provided to the fourth node ND54 of the second buffer chip 500 through the second node ND62.

In the second buffer chip 500, the DCC 520 may perform the duty correction operation on the output signal received from the output buffer 640 included in the memory chip 600. The output buffer 530 may buffer the output of the DCC 520. In an example embodiment, the switch SW5 may be turned off and the output of the output buffer 530 may not be provided to the second node ND52.

In an example embodiment, the switch SW4 may be turned on, the switch SW5 may be turned off, and the output of the output buffer 430 may be provided to the input/output pin 402 through the second node ND42. Accordingly, the controller 20 may receive the output of the output buffer 430. The controller 20 may receive the output of the output buffer 430 and thereby monitor the duty correction operation for the nonvolatile memory 40A. In an example embodiment, the controller 20 may determine an end time of the duty correction operation based on a monitoring result and send a duty correction end command or a set feature command to the nonvolatile memory 40A at the determined end time. However, inventive concepts are not limited thereto. The controller 20 may transmit the duty correction end command or the set feature command to the nonvolatile memory 40A when a DCC training period corresponding to a desired (or, alternatively, predetermined) number of clock cycles ends.

Figure 16:
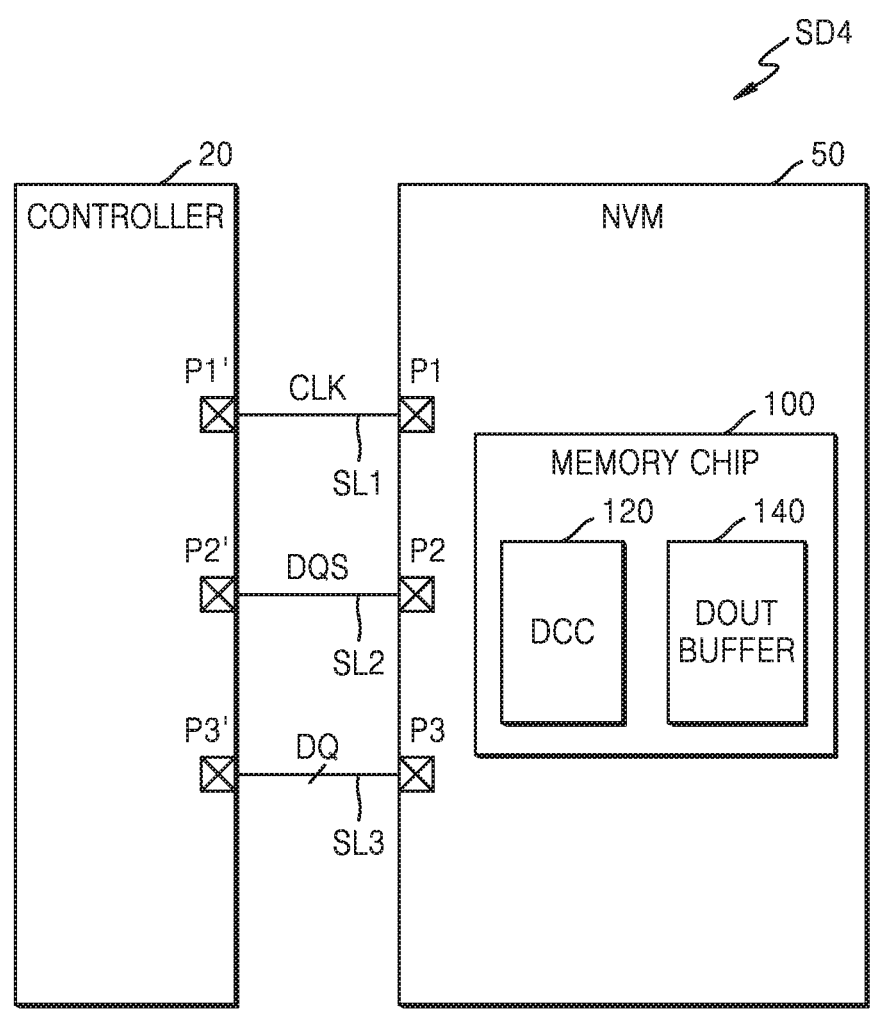
FIG. 16 is a block diagram schematically illustrating a storage device according to an example embodiment of inventive concepts.

FIG. 16 is a block diagram schematically illustrating a storage device SD4 according to an example embodiment of inventive concepts. The storage device SD4 according to the example embodiment corresponds to a modified embodiment of the storage device SD shown in FIG. 1, and descriptions provided with reference to FIGS. 1 to 11B may also be applied to the example embodiment.

Referring to FIG. 16, the storage device SD4 may include a nonvolatile memory 50 and the controller 20. The nonvolatile memory 50 may include the memory chip 100. The nonvolatile memory 50 may be referred to as a single chip memory. The memory chip 100 may include the DCC 120 and the output buffer 140. In a DCC training period, the DCC 120 may perform a duty correction operation on an internal clock signal based on the external clock signal CLK. Further, in the DCC training period, the output buffer 140 may be disabled. Specifically, an output of the output buffer 140 is in a tri-state, that is, in the high impedance Hi-Z state, and the output buffer 140 may be not electrically connected to the second or third pins P2 or P3, and the second or third pin P2 or P3 may be floated. Accordingly, a DCC training operation may reduce the current consumption and/or power consumption, and the DCC training period may be reduced and a readout period is eliminated in the DCC training period.

Figure 17:
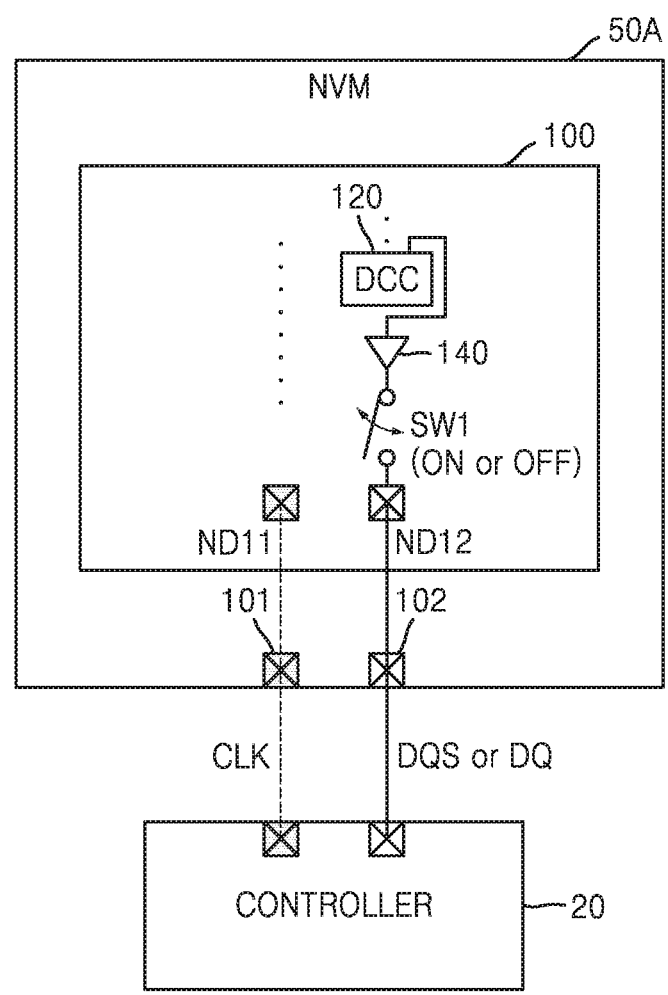
FIG. 17 is a detailed block diagram showing a nonvolatile memory according to an example embodiment of inventive concepts.

FIG. 17 is a detailed block diagram showing a nonvolatile memory 50A according to an example embodiment of inventive concepts. The nonvolatile memory 50A may be an example of the nonvolatile memory 50 of FIG. 16.

Referring to FIG. 17, the nonvolatile memory 50A may include the clock pin 101, the input/output pin 102, and the memory chip 100. The nonvolatile memory 50A may receive the external clock signal CLK, e.g., a read enable signal, from the controller 20 through the clock pin 101 and may provide the data strobe signal DQS or the data DQ to the controller 20 through the input/output pin 102. For example, the clock pin 101 may correspond to the first pin P1 in FIG. 1, and the input/output pin 102 may correspond to the second pin P2 or the third pin P3 in FIG. 1.

The memory chip 100 may include the first node ND11 configured to be connected to the clock pin 101 and the second node ND12 configured to be connected to the input/output pin 102. The memory chip 100 may receive the external clock signal CLK through the first node ND11. The DCC 120 may perform a duty correction operation on an internal clock signal based on the external clock signal CLK. The output buffer 140 may buffer the output of the DCC 120. In an example embodiment, the switch SW1 may be turned on and an output of the output buffer 140 may be connected to the second node ND12 and may be provided to the input/output pin 102 through the second node ND12. In an example embodiment, the switch SW1 may be turned off and the output of the output buffer 140 may not be connected to the second node ND12.

Figure 18:
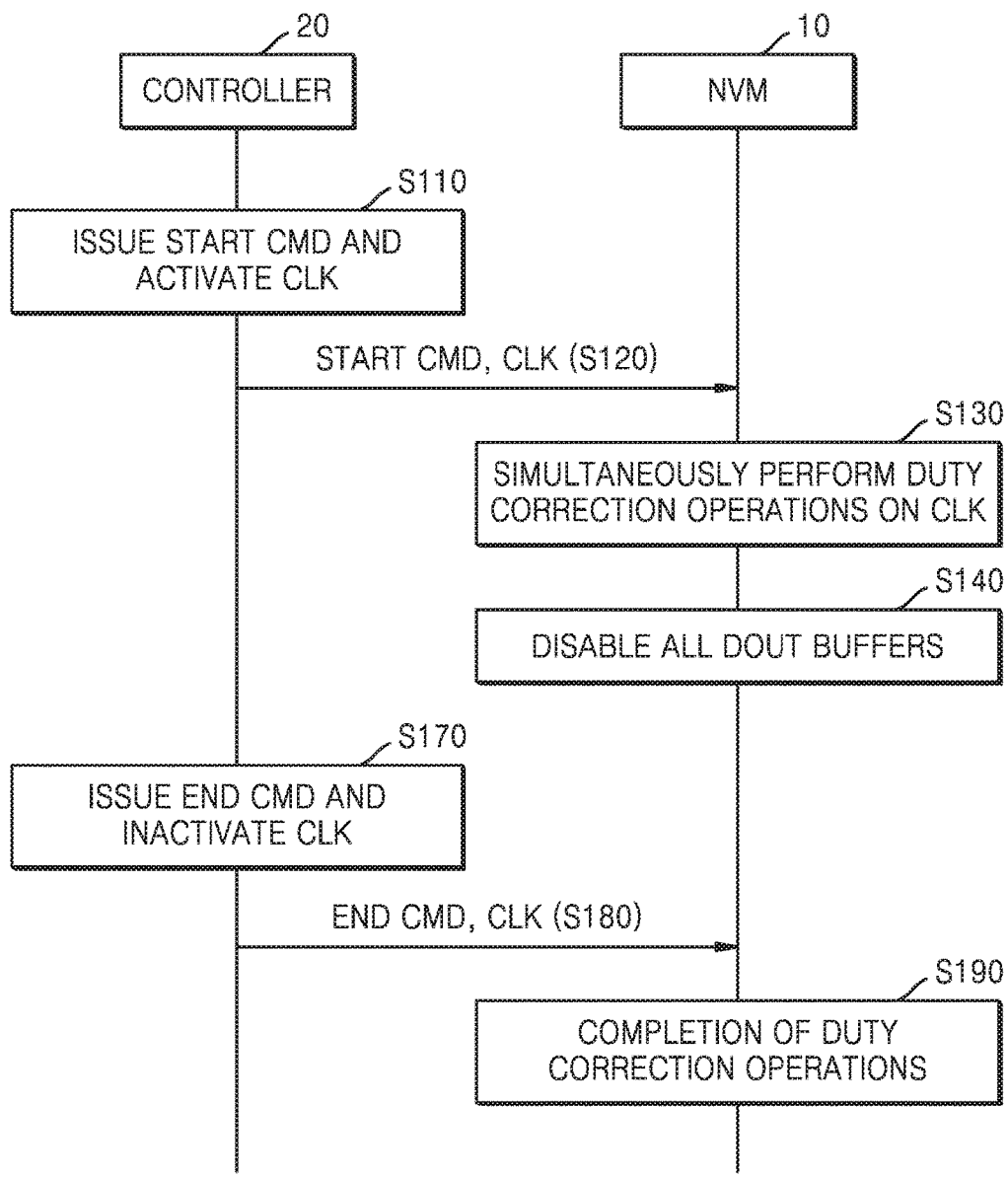
FIGS. 18 and 19 are flowcharts illustrating methods of operating a storage device according to embodiments of inventive concepts.

FIG. 18 is a flowchart illustrating a method of operating a storage device according to an example embodiment of inventive concepts. For example, the nonvolatile memory 10 and the controller 20 may correspond to the nonvolatile memory 10 and the controller 20 of FIG. 1, respectively.

In operation S110, the controller 20 issues a start command indicating a start of DCC training, and activates the clock signal CLK. For example, the start command may be implemented as a set feature command. For example, the start command may correspond to a duty correction start command. In operation S120, the controller 20 transmits the start command and the activated clock signal CLK to the nonvolatile memory 10. For example, the start command may be transmitted from the controller 20 to the nonvolatile memory 10 through the third signal lines SL3, and the clock signal CLK may be transmitted from the controller 20 to the nonvolatile memory 10 through the first signal line SL1.

In operation S130, memory chips included in the nonvolatile memory 10 simultaneously perform duty correction operations on the clock signal CLK. In operation S140, all output buffers included in the nonvolatile memory 10 are disabled. In operation S170, the controller 20 issues an end command instructing an end of DCC training, and inactivates the clock signal CLK. For example, the end command may be implemented as a set feature command. For example, the end command may correspond to a duty correction end command. In operation S180, the controller 20 transmits the end command and the inactivated clock signal CLK to the nonvolatile memory 10. In operation S190, the memory chips included in the nonvolatile memory 10 end the duty correction operations.

Figure 19:
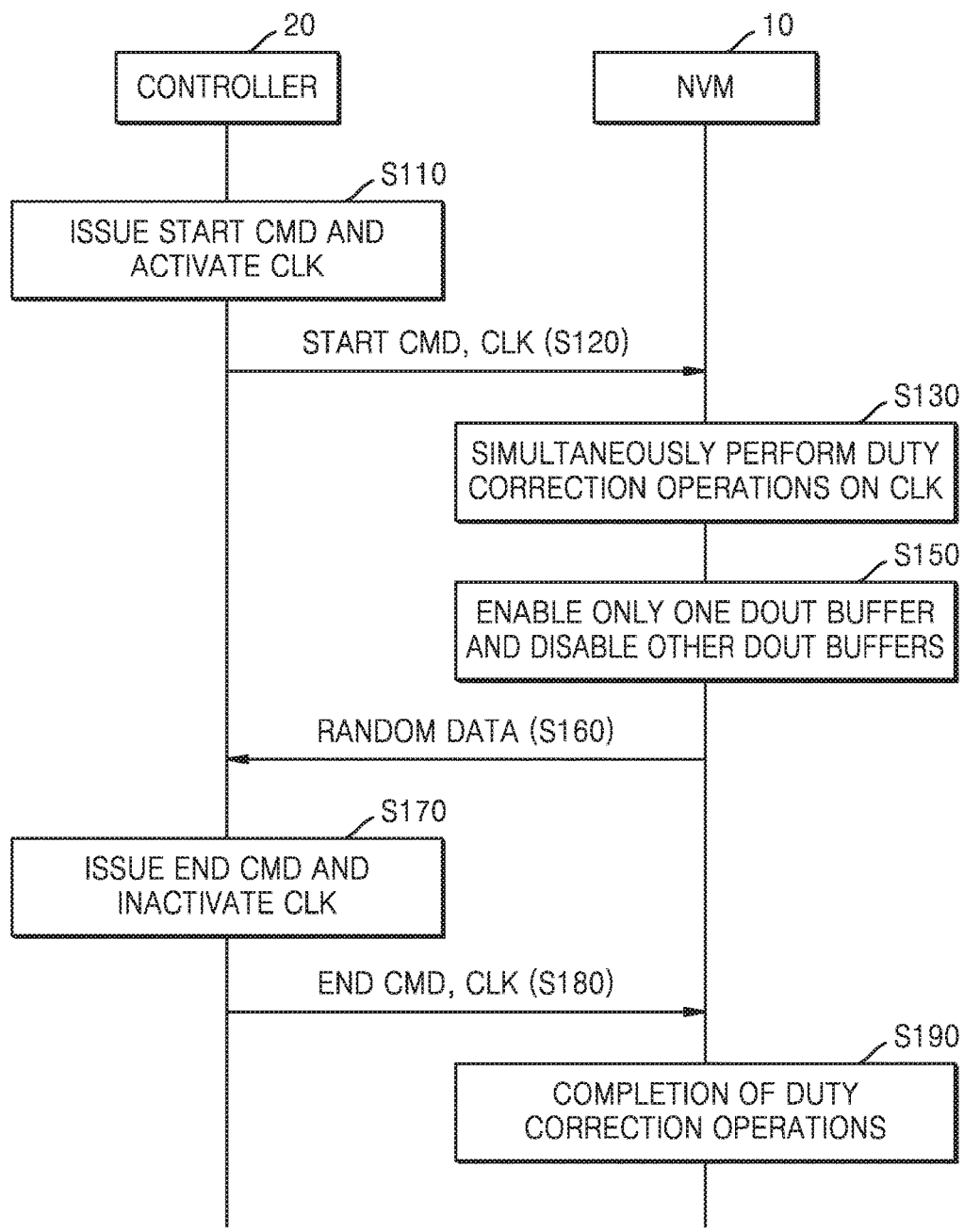

FIG. 19 is a flowchart illustrating a method of operating a storage device according to an example embodiment of inventive concepts. The operation method according to the example embodiment corresponds to a modified embodiment of an operation method illustrated in FIG. 18, and a redundant description will be omitted.

In operation S110, the controller 20 issues a start command indicating a start of DCC training, and activates the clock signal CLK. In operation S120, the controller 20 transmits the start command and the activated clock signal CLK to the nonvolatile memory 10. In operation S130, memory chips included in the nonvolatile memory 10 simultaneously perform duty correction operations on the clock signal CLK.

In operation S150, only one of output buffers included in the nonvolatile memory 10 is enabled, and the remaining output buffers are disabled. In operation S160, the nonvolatile memory 10 transmits random data output from the enabled output buffer to the controller 20. For example, the random data may be transmitted to the controller 20 through the third signal lines SL3. In operation S170, the controller 20 issues an end command instructing an end of DCC training, and inactivates the clock signal CLK. In operation S180, the controller 20 transmits the end command and the inactivated clock signal CLK to the nonvolatile memory 10. In operation S190, the memory chips included in the nonvolatile memory 10 end the duty correction operations.

Figure 20:
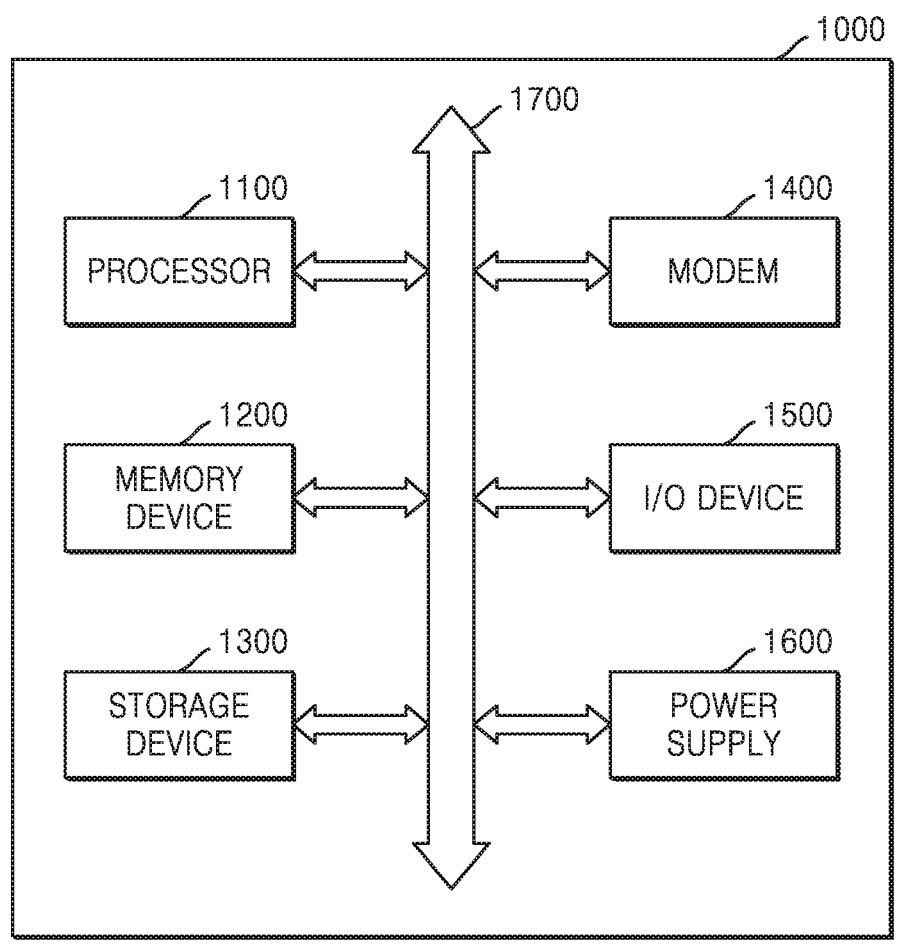
FIG. 20 is a block diagram illustrating an electronic apparatus according to an example embodiment of inventive concepts.

FIG. 20 is a block diagram illustrating an electronic apparatus 1000 according to an example embodiment of inventive concepts.

Referring to FIG. 20, the electronic apparatus 1000 may include a processor 1100, a memory device 1200, a storage device 1300, a modem 1400, an input/output device 1500, and a power supply 1600. The processor 1100, the memory device 1200, the storage device 1300, the modem 1400, the input/output device 1500, and the power supply 1600 may communicate with each other through a bus 1700. In the example embodiment, the storage device 1300 may be implemented according to the embodiments described above with reference to FIGS. 1 through 19. In an example embodiment, the storage device 1300 includes a nonvolatile memory and a controller. The nonvolatile memory includes a plurality of memory chips. Each memory chip may include a DCC and an output buffer. The DCCs included in the plurality of memory chips may perform DCC training in parallel with each other. The output buffers included in the plurality of memory chips may be disabled or only the output buffers included in one of the plurality of memory chips may be enabled, and the output buffers included in the remaining memory chips may be disabled. Accordingly, a DCC training period may be reduced in the storage device 1300, and current consumption and/or power consumption may be reduced during a DCC training operation. In addition, DCC training may secure a more effective data window of readout data, and thus the performance of the storage device 1300 and the overall performance of the electronic apparatus 1000 may be improved.

The embodiments of inventive concepts have been described above with reference to the drawings. Although particular terms are used herein to describe the embodiments, they are merely used to describe the technical idea of inventive concepts and are not intended to limit the scope of inventive concepts as described in the following claims. Therefore, those of ordinary skill in the art will understand that various modifications and other equivalent embodiments may be derived therefrom. Thus, the spirit and scope of inventive concepts should be defined by the appended claims.

While inventive concepts has been particularly shown and described with reference to embodiments thereof, it will be understood that various changes in form and details may be made therein without departing from the spirit and scope of the following claims.

What is claimed is:

1. A nonvolatile memory comprising:
a first memory chip;
a second memory chip;
a clock pin, which is commonly connected to the first and second memory chips, configured to receive an external clock signal during a training period; and
an input/output pin commonly connected to the first and second memory chips,
wherein the first memory chip includes,
a first duty correction circuit (DCC) configured to perform a first duty correction operation on a first internal clock signal based on the external clock signal, and
a first output buffer connected between an output terminal of the first DCC and the input/output pin,
wherein the second memory chip includes,
a second DCC configured to perform a second duty correction operation on a second internal clock signal based on the external clock signal, and
a second output buffer connected between an output terminal of the second DCC and the input/output pin, and
wherein, during the training period, the first DCC is configured to perform the first duty correction operation in parallel with the second DCC performing the second duty correction operation.

2. The nonvolatile memory of claim 1, wherein, during the training period, the first and second output buffers are configured to be disabled, and the input/output pin is configured to float.

3. The nonvolatile memory of claim 1, wherein, during the training period, only the first output buffer is configured to be enabled, the second output buffer is configured to be disabled, and an output of the first output buffer is configured to be output externally through the input/output pin.

4. The nonvolatile memory of claim 1, wherein
the first memory chip includes,
a first internal circuit configured to receive the external clock signal through the clock pin and generate the first internal clock signal from the received external clock signal, and
the second memory chip further includes,
a second internal circuit configured to receive the external clock signal through the clock pin and generate the second internal clock signal from the received external clock signal.

5. The nonvolatile memory of claim 1, wherein the external clock signal is a read enable signal configured to toggle at a frequency during the training period.

6. The nonvolatile memory of claim 5, wherein the read enable signal is configured to toggle at the frequency regardless of operations of the first and second output buffers during the training period.

7. The nonvolatile memory of claim 1, wherein the external clock signal is a data strobe signal configured to toggle at a frequency during the training period.

8. The nonvolatile memory of claim 1, wherein the training period comprises a number of clock cycles.

9. The nonvolatile memory of claim 1, wherein
the first memory chip is configured to start the first duty correction operation upon receiving a duty correction start command and to end the first duty correction operation upon receiving a duty correction end command, and
the second memory chip is configured to start the second duty correction operation upon receiving the duty correction start command and to end the second duty correction operation upon receiving the duty correction end command.

10. The nonvolatile memory of claim 1, wherein
the first memory chip is configured to start the first duty correction operation upon receiving a first set feature command and to end the first duty correction operation upon receiving a second set feature command, and
the second memory chip is configured to start the second duty correction operation upon receiving the first set feature command and to end the second duty correction operation upon receiving the second set feature command.

11. The nonvolatile memory of claim 1, further comprising:
a buffer chip located between (i) the clock pin and the input/output pin and (ii) the first and second memory chips, and configured to receive the external clock signal through the clock pin and to buffer the received external clock signal to provide a buffered external clock signal to the first and second memory chips.

12. The nonvolatile memory of claim 11, wherein the buffer chip comprises a third duty correction circuit (DCC) configured to perform a third duty correction operation on an output of the first output buffer or the second output buffer.

13. A nonvolatile memory comprising:
a clock pin configured to receive an external clock signal during a training period;
an input/output pin configured to transmit and receive a data signal or a data strobe signal;
a buffer chip connected to the clock pin and the input/output pin and configured to buffer the external clock signal to generate a buffered external clock signal;
a first memory chip configured to perform a first duty correction operation on a first internal clock signal based on the buffered external clock signal; and
a second memory chip configured to perform a second duty correction operation on a second internal clock signal based on the buffered external clock signal, the first and second duty correction operations being performed in parallel during the training period,
wherein the buffer chip includes,
a first duty correction circuit (DCC) configured to perform a third duty correction operation on an output signal received from the first memory chip or the second memory chip, and
a first output buffer connected between an output terminal of the first DCC and the input/output pin.

14. The nonvolatile memory of claim 13, wherein, during the training period, the first output buffer is configured to be disabled, and the input/output pin is configured to float.

15. The nonvolatile memory of claim 13, wherein, during the training period, the first output buffer is configured to be enabled, and an output of the first output buffer is configured to be output externally through the input/output pin.

16. The nonvolatile memory of claim 13, wherein
the first memory chip further comprises,
a second DCC configured to perform the first duty correction operation on the first internal clock signal, and
a second output buffer connected between an output terminal of the second DCC and the buffer chip, and
the second memory chip comprises,
a third DCC configured to perform the second duty correction operation on the second internal clock signal, and
a third output buffer connected between an output terminal of the third DCC and the buffer chip.

17. The nonvolatile memory of claim 16, wherein, during the training period, only the second output buffer is configured to be enabled, the third output buffer is configured to be disabled, and an output of the second output buffer is configured to be provided to the buffer chip.

18. The nonvolatile memory of claim 13, wherein the external clock signal is a read enable signal configured to toggle at a frequency during the training period.

19. A nonvolatile memory comprising:
a clock pin configured to receive an external clock signal during a duty correction circuit training period;
an input/output pin configured to transmit and receive a data signal or a data strobe signal; and
a memory chip connected to the clock pin and the input/output pin, wherein the memory chip includes,
an internal circuit configured to receive the external clock signal through the clock pin and generate an internal clock signal from the received external clock signal,
a duty correction circuit (DCC) configured to perform a duty correction operation on the internal clock signal, and
an output buffer connected between an output terminal of the DCC and the input/output pin,
wherein, during the training period, the input/output pin is configured to float.

20. The nonvolatile memory of claim 19, wherein, during the training period, the output buffer is configured to be disabled.

* * * * *

UNITED STATES PATENT AND TRADEMARK OFFICE
CERTIFICATE OF CORRECTION

PATENT NO. : 10,482,935 B2
APPLICATION NO. : 15/982431
DATED : November 19, 2019
INVENTOR(S) : Jung-june Park et al.

It is certified that error appears in the above-identified patent and that said Letters Patent is hereby corrected as shown below:

In the Specification

Column 1 Lines 9-14 should be corrected to read:
This application claims the benefit of U.S. Serial No. 62/513,507, filed on June 1, 2017, in the U.S. Patent and Trademark Office, and Korean Patent Application No. 10-2017-0097815, filed on August 1, 2017, in the Korean Intellectual Property Office, the disclosures of each of which are incorporated herein in their entireties by reference.

Signed and Sealed this
Eighth Day of November, 2022

Katherine Kelly Vidal
*Director of the United States Patent and Trademark Office*